US012633873B2

(12) United States Patent　　(10) Patent No.: US 12,633,873 B2
Lee　　(45) Date of Patent: May 19, 2026

(54) DUAL RESONATOR STRUCTURE FOR OVEN-CONTROLLED MEMS OSCILLATORS, INCLUDING RELATED APPARATUSES

(71) Applicant: Microchip Technology Incorporated, Chandler, AZ (US)

(72) Inventor: Seungbae Lee, San Jose, CA (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 18/818,810

(22) Filed: Aug. 29, 2024

(65) Prior Publication Data

US 2025/0080050 A1　　Mar. 6, 2025

Related U.S. Application Data

(60) Provisional application No. 63/580,254, filed on Sep. 1, 2023.

(51) Int. Cl.
H03B 5/04 (2006.01)
H03B 5/30 (2006.01)
(Continued)

(52) U.S. Cl.
CPC ................. H03B 5/04 (2013.01); H03B 5/30 (2013.01); H03H 3/0076 (2013.01);
(Continued)

(58) Field of Classification Search
CPC ............. H03H 9/02448; H03H 9/2405; H03H 9/2431; H03H 3/0076; H03H 3/0077; H03B 5/04; H03B 5/30; H03L 1/04
See application file for complete search history.

(56) References Cited

U.S. PATENT DOCUMENTS 7,750,758 B2　7/2010　Zhiyu et al.
10,247,621 B1 *　4/2019　Partridge ............. H03K 3/0315
(Continued)

FOREIGN PATENT DOCUMENTS

EP　　2395660 A1　12/2011

OTHER PUBLICATIONS

Salvia, James C., et al. "Real-time temperature compensation of MEMS oscillators using an integrated micro-oven and a phase-locked loop." Journal of Microelectromechanical Systems 19.1 (2009): 192-201. (Year: 2009).*

(Continued)

*Primary Examiner* — Ryan Johnson
(74) *Attorney, Agent, or Firm* — TraskBritt

(57) ABSTRACT

An apparatus comprises a microelectromechanical system (MEMS) including a semiconductor body. The semiconductor body comprises a first resonator, a second resonator, a supporting portion, and one or more heating elements of a heater. The first resonator is to resonate at a first resonating frequency that is generally frequency-stable over a predetermined temperature range. The second resonator is to resonate at a second resonating frequency that is generally linearly decreasing or increasing as temperature increases over the predetermined temperature range. The supporting portion is to support both the first resonator and the second resonator. The one or more heating elements of the heater are on, or in, the supporting portion.

28 Claims, 19 Drawing Sheets

(51) Int. Cl.

| | |
|---|---|
| *H03H 3/007* | (2006.01) |
| *H03H 9/02* | (2006.01) |
| *H03H 9/08* | (2006.01) |
| *H03H 9/24* | (2006.01) |
| *H03L 1/04* | (2006.01) |

(52) U.S. Cl.

CPC .... *H03H 9/02244* (2013.01); *H03H 9/02448* (2013.01); *H03H 9/08* (2013.01); *H03H 9/2431* (2013.01); *H03H 9/2447* (2013.01); *H03L 1/04* (2013.01)

(56) References Cited

U.S. PATENT DOCUMENTS

| | | | |
|---|---|---|---|
| 10,622,973 | B1 | 4/2020 | Partridge et al. |
| 2007/0290764 | A1 | 12/2007 | Partridge et al. |
| 2011/0163819 | A1 | 7/2011 | Badillo et al. |
| 2019/0097600 | A1* | 3/2019 | Yoshii ................. H03H 9/1057 |
| 2020/0220549 | A1* | 7/2020 | Oja .......................... H03B 5/04 |

OTHER PUBLICATIONS

DualMEMS and Turbo Compensation Temperature Sensing Technology, SiTime Corporation, Sep. 2018, 6 pages.

Melamud, R. et al., MEMS Enables Oscillators With Sub-PPM Frequency Stability and Sub-PS Jitter, SiTime Corporation, Solid-State Sensors, Actuators and Microsystems Workshop, Hilton Head Island, South Carolina, Jun. 3-7, 2012, pp. 66-69.

Pensala, T. et al., Temperature Compensation of Silicon MEMS Resonators by Heavy Doping, 2011 IEEE International Ultrasonics Symposium Proceedings, pp. 1952-1955.

ROM7050PA Mercury+™ IC OCXO | 5G RRHS and Small Cells, Rakon Limited, Aug. 31, 2023, 2 pages.

Roshan, M. H. et al., A MEMS-Assisted Temperature Sensor With 20-μK Resolution, Conversion Rate of 200 S/s, and FOM of 0.04 pJK², IEEE Journal of Solid-State Circuits, vol. 52, No. 1, Jan. 2017, pp. 185-197.

SiT5357 60-220 MHz, ±0.1 to ±0.25 ppm, Stratum 3, Elite Platform™ Precision Super-TCXO, Rev 1.03, SiTime Corporation, Aug. 2, 2018, 35 pages.

International Search Report of International Application No. PCT/US2024/044334, mailed Dec. 16, 2024, 4 pages.

Rodriguez, J. et al., Damping Mechanisms in Light and Heavy-Doped Dual-Ring and Double-Ended Tuning Fork Resonators (DETF), 2015 Transducers, 2015 18th International Conference on Solid-State Sensors, Actuators and Microsystems (Transducers), IEEE, Jun. 21, 2015, pp. 2005-2008.

Written Opinion of the International Searching Authority of International Application No. PCT/US2024/044334, mailed Dec. 16, 2024, 9 pages.

Campanella Humberto et al: "Dual MEMS Resonator Structure for Temperature Sensor Applications", IEEE Transactions on Electron Devices, IEEE, USA, vol. 64, No. 8, Aug. 28, 2017 (Aug. 28, 2017), pp. 3368-3376, XP011657254, ISSN: 0018-9383, DOI: 10.1109/TED.2017.2708129.

Fei Sitao et al: "Temperature Characteristics of a Contour Mode MEMS AlN Piezoelectric Ring Resonator on SOI Substrate", Micromachines (Basel), [Online] vol. 12, No. 2, Jan. 29, 2021 (Jan. 29, 2021), pp. 1-13, XP093342143, Switzerland ISSN: 2072-666X, DOI: 10.3390/mi12020143 Retrieved from the Internet: URL:https://www.mdpi.com/2072-666X/12/2/14 3/pdf>.

Heidarpour Roshan Meisam et al: "A MEMS-Assisted Temperature Sensor With 20-μK Resolution, Conversion Rate of 200 S/s, and FOM of 0.04 pJK²", IEEE Journal of Solid-State Circuits, IEEE, USA, vol. 52, No. 1, Jan. 28, 2017 (Jan. 28, 2017), pp. 185-197, XP011638637, ISSN: 0018-9200, DOI: 10.1109/JSSC.2016.2621035.

International Search Report of International Application No. PCT/US2024/044335, mailed Jan. 2, 2026, 4 pages.

Written Opinion of the International Searching Authority of International Application No. PCT/US2024/044335, mailed Jan. 2, 2026, 9 pages.

Wu Zhengzheng et al: "A temperature-stable mems oscillator on an ovenized micro-platform using a PLL-based heater control system", 2015 28th IEEE International Conference on Microsystems (MEMS), IEEE, Jan. 18, 2015 (Jan. 18, 2015), pp. 793-796, XP032740888, DOI: 10.1109/MEMSYS.2015.7051078.

\* cited by examiner $$Power = \frac{(V_{h+} - V_{h-})^2}{R_{coil}\left(\frac{R_{via}}{R_{coil}} + \frac{1}{2}\right)}$$

*First Resonator (Reference)*

DUAL RESONATOR STRUCTURE FOR OVEN-CONTROLLED MEMS OSCILLATORS, INCLUDING RELATED APPARATUSES

CROSS-REFERENCE TO RELATED APPLICATIONS

This application claims the benefit under 35 U.S.C. §119(e) of U.S. Provisional Patent Application No. 63/580,254, filed Sep. 1, 2023, and titled "Dual Resonator Structure for Oven-Controlled MEMS Oscillators," the entire disclosure of which is hereby incorporated herein by reference. The subject matter of this application is also related to U.S. patent application Ser. No. 18/818,787, filed Aug. 29, 2024, the entire disclosure of which is hereby incorporated herein by reference.

TECHNICAL FIELD

Examples relate, generally, to resonators for timing applications. More specifically, some examples relate to micro-electromechanical (MEMS) resonators for oven-controlled MEMS oscillators, without limitation.

BACKGROUND

Mechanically vibrating devices are used in communication systems, as well as other systems that require a frequency reference, in a variety of applications and operational contexts. Although quartz-based resonant devices and other acoustic devices are widely used in electronic systems, traditional quartz crystal oscillators are relatively large in comparison to other components in these systems. This is especially true in applications where miniaturization is required. Due to their mechanical nature and specific fabrication processes, these devices may be more challenging to integrate with their associated electronic circuitry. Some integrated circuits (ICs) with precise timing requirements rely on an external crystal or a crystal oscillator module. On the other hand, silicon-based microelectromechanical systems (MEMS) are attractive for use as compact, single-chip integrated or directly integrated frequency references.

BRIEF DESCRIPTION OF THE DRAWINGS

While this disclosure concludes with claims particularly pointing out and distinctly claiming specific examples, various advantages of examples within the scope of this disclosure may be more readily ascertained from the following description when read in conjunction with the accompanying drawings, in which:

DETAILED DESCRIPTION

Figure 1:
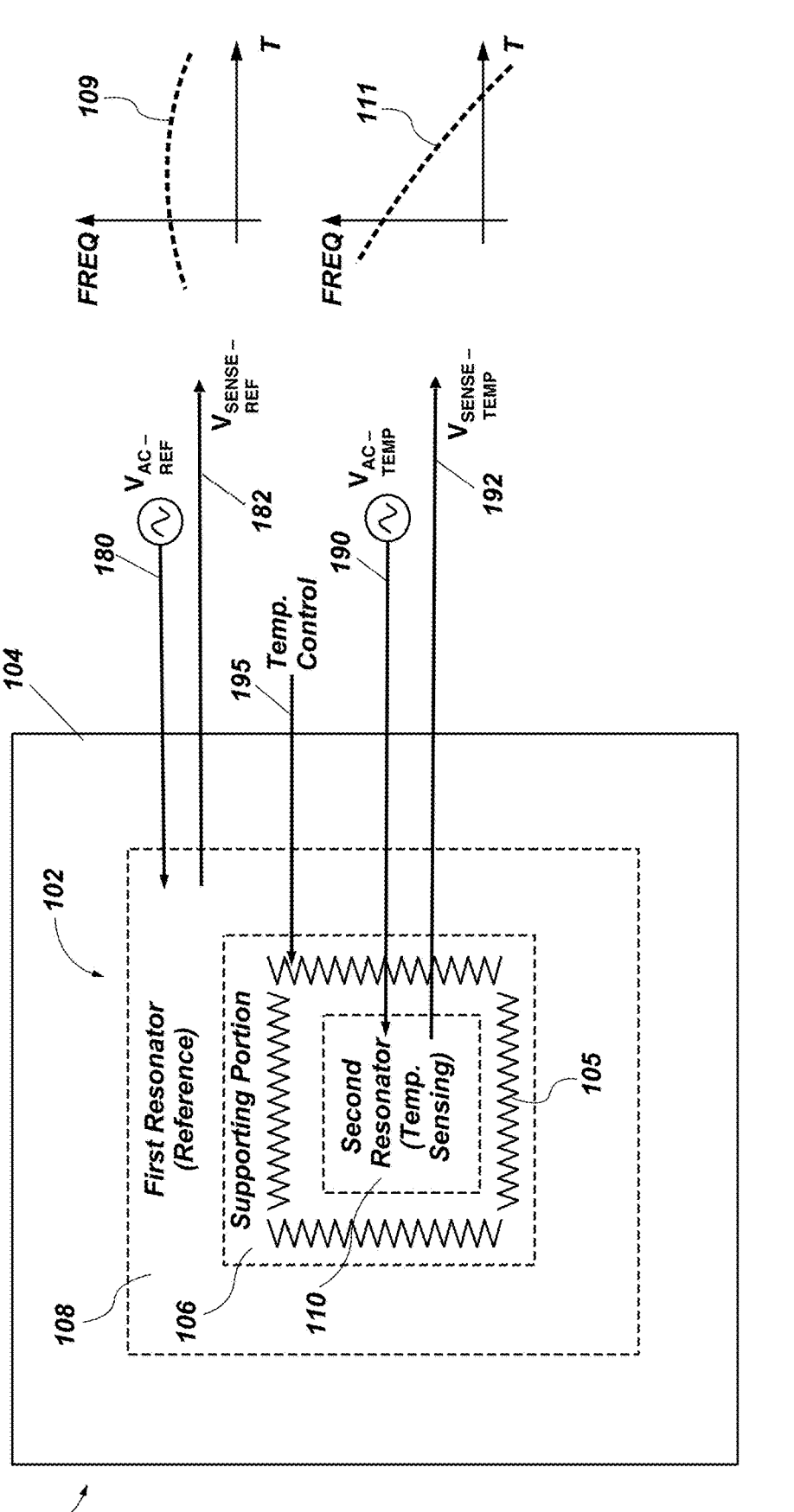
FIG. 1 is a block diagram of an apparatus including a microelectromechanical system (MEMS) comprising a semiconductor body on a MEMS die, the semiconductor body comprising a first resonator (a reference resonator, without limitation), a second resonator (a temperature-sensing resonator, without limitation), and a supporting portion to support both the first resonator and the second resonator ("dual resonator structure"), where the supporting portion includes one or more heating elements of a heater, according to one or more examples.

In the following detailed description, reference is made to the accompanying drawings, which form a part hereof, and in which are shown, by way of illustration, specific examples of examples in which the present disclosure may be practiced. These examples are described in sufficient detail to enable a person of ordinary skill in the art to practice the present disclosure. However, other examples may be utilized, and structural, material, and process changes may be made without departing from the scope of the disclosure.

The illustrations presented herein are not meant to be actual views of any particular method, system, device, or structure, but are merely idealized representations that are employed to describe the examples of the present disclosure. The drawings presented herein are not necessarily drawn to scale. Similar structures or components in the various drawings may retain the same or similar numbering for the convenience of the reader; however, the similarity in numbering does not mean that the structures or components are necessarily identical in size, composition, configuration, or any other property.

The following description may include examples to help enable one of ordinary skill in the art to practice the disclosed examples. The use of the terms "exemplary," "by example," and "for example," means that the related description is explanatory, and though the scope of the disclosure is intended to encompass the examples and legal equivalents, the use of such terms is not intended to limit the scope of an example of this disclosure to the specified components, steps, functions, or the like.

It will be readily understood that the components of the examples as generally described herein and illustrated in the drawings could be arranged and designed in a wide variety of different configurations. Thus, the following description of various examples is not intended to limit the scope of the present disclosure but is merely representative of various examples. While the various aspects of the examples may be presented in drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be depicted by block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art would understand that information and signals may be represented using any of a variety of different technologies and techniques. For example, data, instructions, commands, information, signals, bits, and symbols that may be referenced throughout this description may be represented by voltages, currents, electromagnetic waves, magnetic fields or particles, optical fields or particles, or any combination thereof. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal. A person having ordinary skill in the art would appreciate that this disclosure encompasses communication of quantum information and qubits used to represent quantum information.

The various illustrative logical blocks, modules, and circuits described in connection with the examples disclosed herein may be implemented or performed with a general purpose processor, a special purpose processor, a Digital Signal Processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer executes computing instructions (e.g., software code, without limitation) related to examples of the present disclosure.

The examples may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, or a subprogram, without limitation. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

In this description the term "coupled" and derivatives thereof may be used to indicate that two elements co-operate or interact with each other. When an element is described as being "coupled" to another element, then the elements may be in direct physical or electrical contact or there may be intervening elements or layers present. In contrast, when an element is described as being "directly coupled" to another element, then there are no intervening elements or layers present. In this description, the term "connected" is used interchangeably with the term "coupled," and has the same meaning, unless expressly indicated otherwise or the context would indicate otherwise to a person having ordinary skill in the art.

One of the most dominant environmental factors that affects the frequency of a crystal oscillator (XO) is temperature. Traditional oven-controlled crystal oscillators (OCXOs) include a crystal oscillator and a temperature sensor (e.g., a thermistor) which are contained in an oven. In a traditional OCXO, a temperature controller reads the temperature from the temperature sensor to control (e.g., adjust) a heater to heat the oven to maintain the crystal oscillator at a required temperature for operation.

In some traditional OCXOs, the crystal oscillator and the oven have a relatively large size, and a relatively high power is therefore needed to maintain the required temperature. There also exists a limited thermal coupling between the crystal oscillator and the temperature sensor. The temperature reading from the temperature sensor is largely correlated with the sensor itself, not with the crystal oscillator. Because a temperature offset exists between the crystal oscillator and the temperature sensor, the temperature reading and resulting adjustment may not be accurate. In addition, a thermal gradient that exists between the crystal oscillator and the temperature sensor causes their respective temperatures to be out-of-sync with each other, especially when undergoing relatively fast temperature transients. Because the crystal oscillator and the temperature sensor do not track equally, it is difficult to simultaneously read and correlate their respective temperatures. In addition, the temperature sensor may provide an analog output signal which may be relatively noisy and require use of an ADC. In some cases, the ADC may have a limited number of ADC bits which will undesirably limit the resolution of the temperature readout to result in compensation inaccuracies.

According to one or more examples of the disclosure, a microelectromechanical system (MEMS) includes a semiconductor body comprising a first resonator (e.g., a reference resonator, without limitation), a second resonator (e.g., a temperature-sensing resonator, without limitation), and a supporting portion to support both the first resonator and the second resonator (herein referred to as a "dual resonator structure"). The supporting portion of the semiconductor body includes one or more heating elements of a heater.

In one or more examples, the dual resonator structure may be provided for use in an oven-controlled MEMS oscillator ("OCMO"). In one or more examples, the first resonator, the second resonator, and the supporting portion are contained within a thermally-insulating enclosure of an oven (e.g., of an OCMO). The one or more heating elements may be used to heat the dual resonator structure to (e.g., maintain the dual resonator structure at) a predetermined temperature.

In one or more examples, the first resonator is to resonate at a first resonating frequency that is relatively (as compared to the second resonator) frequency-stable (or temperature insensitive) over a predetermined temperature range (e.g., an operating temperature range, without limitation). The second resonator is to resonate at a second resonating frequency that is relatively (as compared to the first resonator) temperature-dependent (or temperature sensitive) over the predetermined temperature range. In one or more examples, the second resonator is to resonate at a second resonating frequency that decreases (e.g., generally linearly) as temperature increases over the predetermined temperature range. In one or more other examples, the second resonator is to resonate at a second resonating frequency that increases (e.g., generally linearly) as temperature increases over the predetermined temperature range.

In one or more examples, the first resonator and the second resonator are mechanically and/or thermally coupled or connected to each other via the supporting portion. In one or more examples, the first and the second resonators share the same single supporting portion, as a single body, on the same MEMS die. As a result of the sharing of the supporting portion, the temperatures of the first and the second resonators may be (e.g., almost or substantially, without limitation) identical.

In one or more examples, the semiconductor body is made of a highly-doped, single crystal silicon. In one or more examples, the first and the second resonators of the dual resonator structure have different frequency versus temperature profiles by engineering the acoustic wave vibration propagations and/or the doping levels of the single crystal silicon.

In one or more examples, the dual resonator structure is provided in a compact configuration on a single die having a relatively small die size. In one or more examples, the first and the second resonators on the same single MEMS die provides an improved thermal coupling between the first and the second resonators. Thus, in one or more examples, the temperature offset and the thermal gradient between the first and the second resonators may be substantially reduced. In one or more examples, there may be zero (e.g., a zero, an almost zero, or negligible, without limitation) temperature offset and/or zero (e.g., a zero, an almost zero, or negligible, without limitation) thermal gradient between the first and the second resonators. Accordingly, in one or more examples, a temperature extracted from the dual resonator structure may be more accurate.

In one or more examples, the temperature of the dual resonator structure may be extracted from the first and the second resonators at least partially based on the difference in frequency changes of the first and the second resonating frequencies. As the temperature changes, the difference in the frequency changes of the first and the second resonating frequencies varies proportionally. By directly measuring the difference in the changes of the two frequencies, the temperature of the dual resonator structure may be extracted. Adjustments to the heater of the oven may be made based on the extracted temperature.

In one or more examples, a temperature control circuitry may be used to control a voltage or current through the one or more heating elements of the heater to maintain the temperature of the dual resonator structure at a predetermined temperature. Maintaining the temperature of the dual resonator structure at the predetermined temperature includes (e.g., regular) adjustments to the voltage or current of the one or more heating elements. In one or more examples, the adjustments to the voltage or current through the one or more heating elements may be at least partially based on a ratio of changes in the first temperature of the first resonator (the reference resonator, without limitation) and the second temperature of the second resonator (the temperature-sensing resonator, without limitation).

FIG. 1 is a block diagram of an apparatus 100 including a MEMS comprising a semiconductor body 102 on a MEMS die 104. Semiconductor body 102 comprises a first resonator 108 (e.g., a reference resonator, without limitation), a second resonator 110 (e.g., a temperature-sensing resonator, without limitation), and a supporting portion 106 to support both first resonator 108 and second resonator 110. Supporting portion 106 includes one or more heating elements 105 of a heater (e.g., disposed on, or in, supporting portion 106). Semiconductor body 102 including first resonator 108, second resonator 110, and supporting portion 106 (including one or more heating elements 105) may be referred to herein as a "dual resonator structure," according to one or more examples.

As shown in FIG. 1, first resonator 108 and second resonator 110 of semiconductor body 102 share the same supporting portion 106 of semiconductor body 102. In one or more examples, first resonator 108 and second resonator 110 are mechanically and/or thermally coupled or connected to each other via supporting portion 106. In one or more examples, first resonator 108, second resonator 110, and supporting portion 106 may be integrally formed as part of the same semiconductor body 102.

In one or more examples, first resonator 108 and second resonator 110 are located on opposite sides of semiconductor body 102. As a specific, non-limiting example as shown in FIG. 1, first resonator 108 may be located at an outer portion (e.g., an outer peripheral portion) of semiconductor body 102, second resonator 110 may be located at a central portion of semiconductor body 102, and supporting portion 106 may be located within an intermediary portion of semiconductor body 102 (interposed between first resonator 108 and second resonator 110).

In one or more alternative examples, first resonator 108, second resonator 110, and supporting portion 106 may be arranged in a configuration different from that shown and described in relation to FIG. 1 (e.g., many variations on the configuration are possible and within the scope of the disclosure), and/or may be respectively located at positions of or along semiconductor body 102 different from that shown and described in relation FIG. 1 (e.g., many variations on the relative location of the portions are possible and within the scope of the disclosure).

A first drive signal 180 (e.g., $V_{AC\text{-}REF}$) is generated to drive at least one drive electrode of first resonator 108 to cause first resonator 108 to resonate or vibrate at a first resonating frequency. In response to first drive signal 180, a first sense signal 182 (e.g., $V_{SENSE\text{-}REF}$) (e.g., a reference signal) having the first resonating frequency is sensed from at least one sense electrode of first resonator 108. Similarly, a second drive signal 190 (e.g., $V_{AC\text{-}TEMP}$) is generated to drive at least one drive electrode of second resonator 110 to cause second resonator 110 to resonate or vibrate at a second resonating frequency. In response to second drive signal 190, a second sense signal 192 (e.g., $V_{SENSE\text{-}TEMP}$) (e.g., a temperature signal) having the second resonating frequency is sensed from at least one sense electrode of second resonator 110.

In one or more examples, first resonator 108 is configured as a reference resonator, and second resonator 110 is configured as a temperature-sensing resonator. In one or more examples, first resonator 108 is to resonate at a first resonating frequency that is generally frequency-stable over a predetermined temperature range. A frequency versus temperature profile 109 of first resonator 108 of FIG. 1 illustrates one example of a generally frequency-stable frequency associated with first resonator 108. In one or more examples, second resonator 110 is to resonate at a second resonating frequency that generally decreases as temperature increases over the predetermined temperature range. A frequency versus temperature profile 111 of second resonator 110 of FIG. 1 illustrates one example of a generally temperature-dependent frequency associated with second resonator 110. In one or more other examples, second resonator 110 is to resonate at a second resonating frequency that generally increases as temperature increases over the predetermined temperature range. In one or more examples, first resonator 108 has a first temperature coefficient of frequency and second resonator 110 has a second temperature coefficient of frequency. The second temperature coefficient of frequency of second resonator 110 is different from the first temperature coefficient of frequency of first resonator 108.

One or more heating elements 105 are disposed on, or in, supporting portion 106 of semiconductor body 102. In one or more examples, one or more heating elements 105 are embedded on, or in, supporting portion 106, and may be referred to as embedded heating elements of supporting portion 106. In one or more examples, one or more heating elements 105 are evenly distributed on, or in, supporting portion 106. When first resonator 108, second resonator 110, and supporting portion 106 are contained within a thermally-insulating enclosure of an oven (not shown in FIG. 1), one or more heating elements 105 may be used to heat the dual resonator structure.

More specifically, a temperature control circuitry may be used to control a voltage or current through one or more heating elements 105 to maintain a temperature of the dual resonator structure at a predetermined temperature. This temperature control is indicated as a temperature control signal 195 in FIG. 1. Maintaining the temperature of the dual resonator structure at the predetermined temperature may include (e.g., regular) adjustments to the voltage or current of the one or more heating elements 105. In one or more examples, the adjustments to the voltage or current through one or more heating elements 105 may be at least partially based on a ratio of changes in the first temperature of first resonator 108 (the reference resonator) and the second temperature of second resonator 110 (the temperature-sensing resonator). Such a technique assists in maintaining frequency stability of the reference frequency of first resonator 108.

Figure 2:
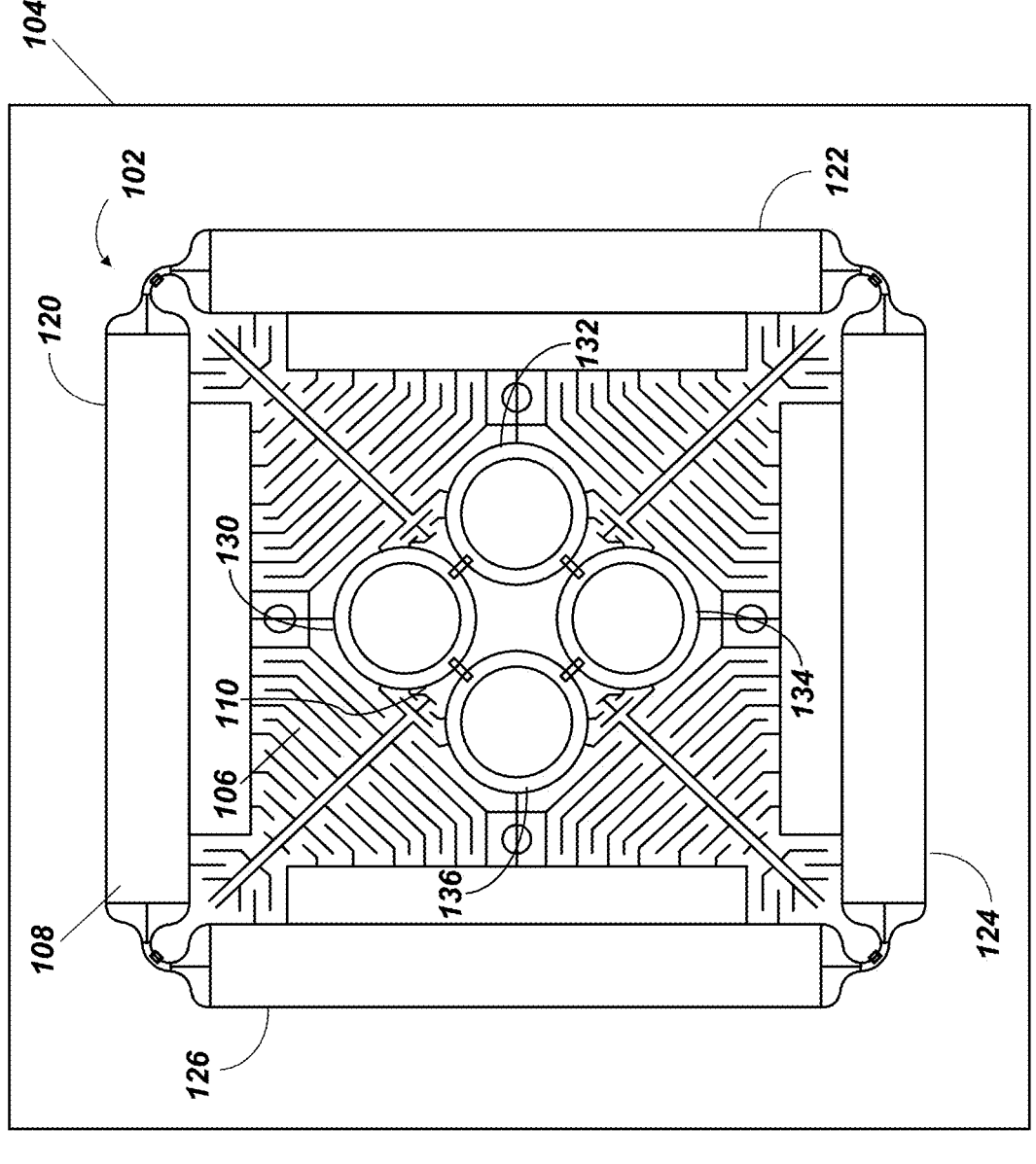
FIG. 2 is a top-down view of an example of the apparatus of FIG. 1, where the first resonator comprises a multi-beam resonator (e.g., along an outer portion of the semiconductor body) and the second resonator comprises a multi-ring resonator (e.g., at a central portion of the semiconductor body), according to one or more examples.

FIG. 2 is a top-down view of a specific, non-limiting example of apparatus 100 of FIG. 1. Semiconductor body 102 may have a generally square, rounded square, circular, or rectangular body. In one or more examples, first resonator 108 comprises a multi-beam resonator along an outer portion of semiconductor body 102, and second resonator 110 comprises a multi-ring resonator at a central portion of semiconductor body 102. More specifically, first resonator 108 is shown as a four-beam square ring resonator having four (4) beams 120, 122, 124, and 126, and second resonator 110 is shown as a four-ring resonator having four (4) rings 130, 132, 134, and 136. Respective ones of beams 120, 122, 124, and 126 and respective ones of rings 130, 132, 134, and 136 may be referred to as "resonating portions" of the respective resonator.

Figure 3B:
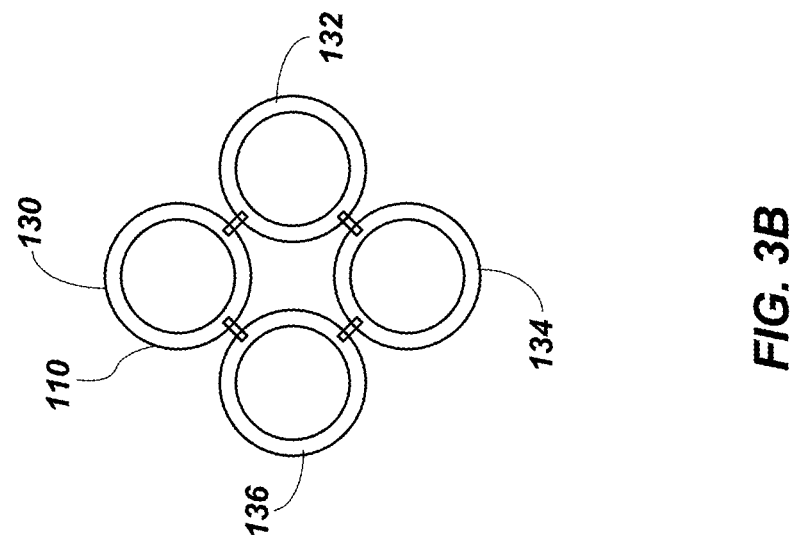
FIG. 3B is a top-down view of the second resonator of FIG. 2 (the multi-ring resonator, without limitation), with the remaining portion of the semiconductor body removed for illustrative clarity, according to one or more examples.
Figure 3A:
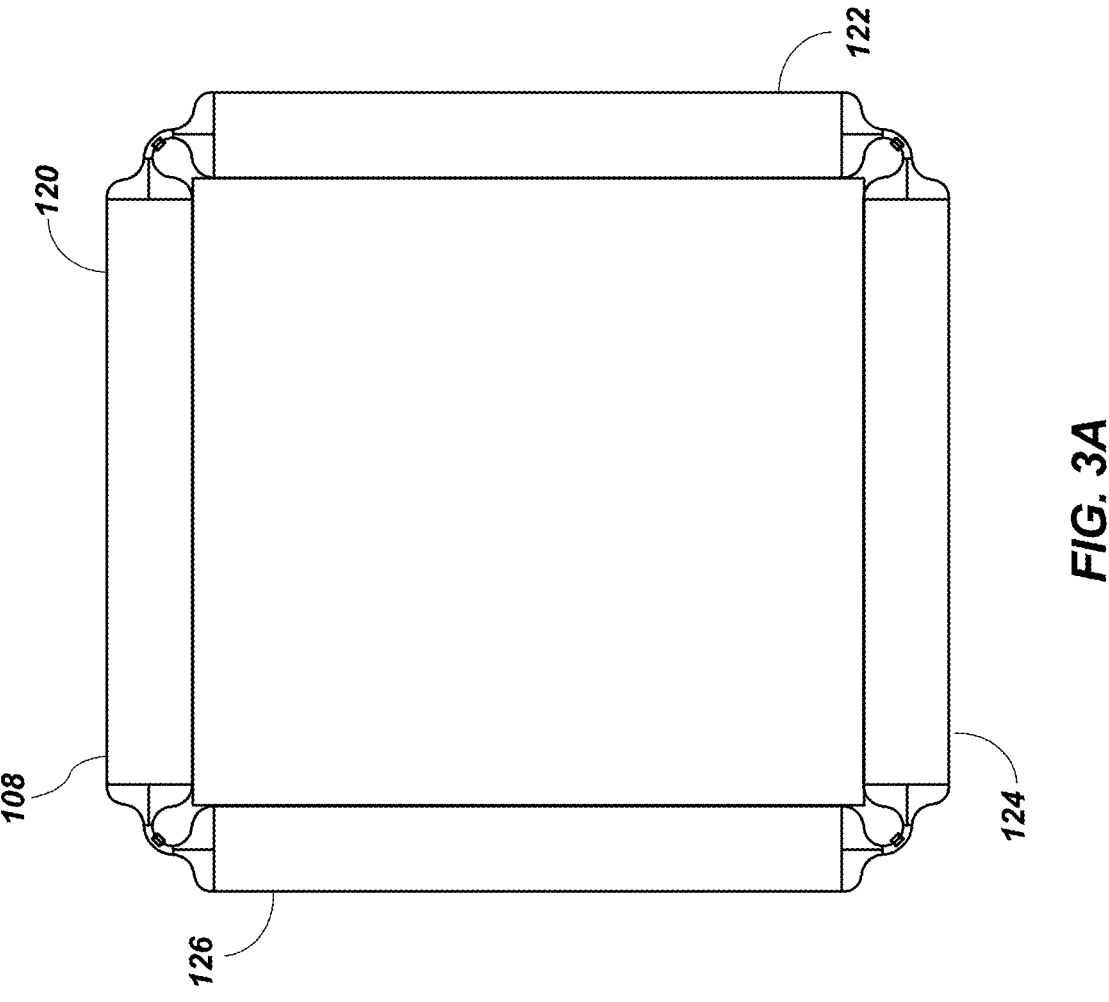
FIG. 3A is a top-down view of the first resonator of FIG. 2 (the multi-beam resonator, without limitation), with the remaining portion of the semiconductor body removed for illustrative clarity, according to one or more examples.

FIG. 3A is a top-down view of first resonator 108 of FIG. 2 (the multi-beam resonator, without limitation), with the remaining portion of semiconductor body 102 removed for illustrative clarity.

FIG. 3B is a top-down view of second resonator 110 of FIG. 2 (the multi-ring resonator, without limitation), with the remaining portion of semiconductor body 102 removed for illustrative clarity.

Figure 4:
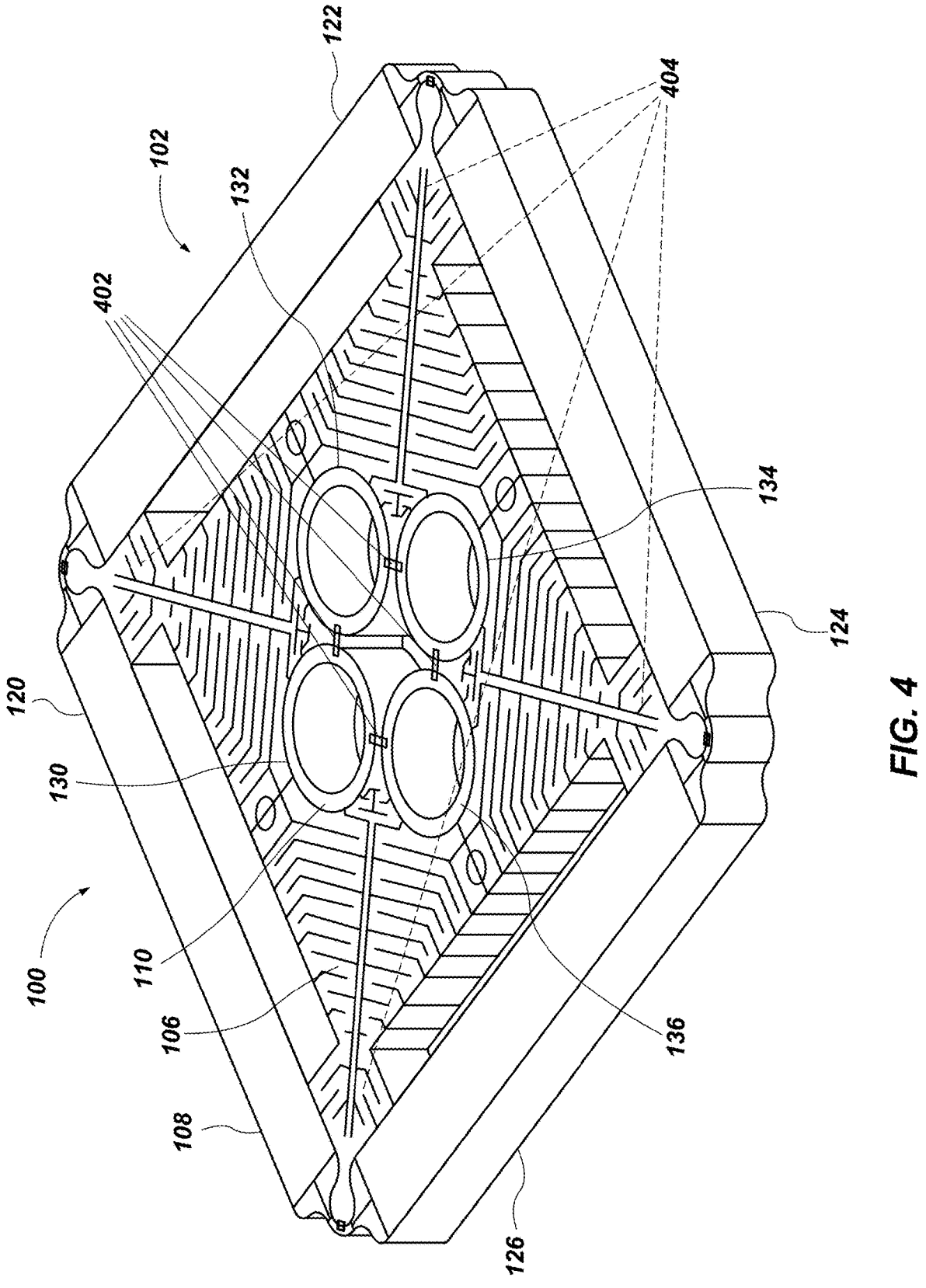
FIG. 4 is a perspective view of the apparatus of FIG. 2, according to one or more examples.

FIG. 4 is a perspective view of apparatus 100, according to one or more examples. Supporting portion 106 structurally supports, and physically and thermally connects to, first and second resonators 108 and 110. For first resonator 108, supporting portion 106 includes corner connecting portions 404 to connect to respective corners of respective ends of beams 120, 122, 124, and 126 of first resonator 108. First resonator 108 may comprise attachment methods between beams which does not restrict expansion or contraction of the beams. For second resonator 110, supporting portion 106 surrounds and supports portions of outer edges of rings 130, 132, 134, and 136 of second resonator 110. Also for second resonator 110, respective ones of rings 130, 132, 134, and 136 are connected to respective adjacent rings with respective coupling beams 402. Second resonator 110 may comprise attachment methods which also do not restrict expansion or contraction of the rings.

Although spacings are illustrated within and between structures in FIG. 4 (e.g., spacings adjacent respective beams 120, 122, 124, and 126 of first resonator 108, and spacings within respective rings 130, 132, 134, and 136 of second resonator 110), electrode material may be disposed within these spacings. The electrode material may be for electrodes to send drive signals to, and receive sense signals from, first and second resonators 108 and 110, as further described below.

In one or more other examples, respective ones of first resonator 108 and second resonator 110 may be of a different resonator type or configuration than a multi-beam or multi-ring resonator. For example, second resonator 110 may be a single ring resonator, a disc resonator, a square plate resonator, a clamped-clamped resonator, a cantilever resonator, a fixed-fixed beam resonator, or a comb drive resonator. Again, in one or more other examples, first resonator 108, second resonator 110, and supporting portion 106 are arranged in a configuration different from that shown and described in relation to FIGS. 2 and 4 (e.g., many variations on the configuration are possible and within the scope of the disclosure), and/or are respectively located at positions of or along semiconductor body 102 different from that shown and described in relation to FIGS. 2 and 4 (e.g., many variations on the relative location of the portions are possible and within the scope of the disclosure).

In one or more examples, semiconductor body 102 may comprise a heavily-doped, single crystal silicon. In one or more examples, materials for semiconductor body 102 may be or include polycrystalline silicon, monocrystalline silicon, germanium, diamond, tin, carbon, sulfur, selenium, tellurium, or any alloy thereof. Additional or alternative materials for body 102 may be or include one or more of boron nitride (BN), boron (B), phosphide (P), boron arsenide (BAs), aluminum nitride (AlN), aluminum phosphide (AlP), aluminum arsenide (AlAs), aluminum antimonide (AlSb), gallium nitride (GaN), gallium phosphide (GaP), gallium arsenide (GaAs), gallium antimonide (GaSb), indium nitride (InN), indium phosphide (InP), indium arsenide (InAs), indium antimonide (InSb), cadmium selenide (CdSe), cadmium sulfide (CdS), cadmium telluride (CdTe), oxides of any kind (e.g., $Al_2O_3$, ZnO, CuO, PbO, without limitation), zinc selenide (ZnSe), zinc sulfide (ZnS), zinc telluride (ZnTe), cuprous chloride (CuCl), copper sulfide (CuS), lead selenide (PbSe), lead sulfide (PbS), lead telluride (PbTe), tin sulfide (SnS), tin telluride (SnTe), lead tin telluride (PbSnTe), bismuth telluride ($Bi_2Te_3$), cadmium phosphide ($CdP_2$), cadmium arsenide ($CdAs_2$), zinc phosphide ($Zn_3P_2$), zinc diphosphide ($ZnP_2$), zinc arsenide ($Zn_3As_2$), zinc antimonide ($Zn_3Sb_2$), titanium (Ti), copper (Cu), uranium (U), barium titanate ($BaTiO_3$), strontium titanate ($SrTiO_3$), lithium niobate ($LiNbO_3$), vanadium (V), molybdenum disulfide ($MoS_2$), gallium selenide (GaSe), indium selenide (InSe), iron (Fe), or any alloy thereof.

Figure 5:
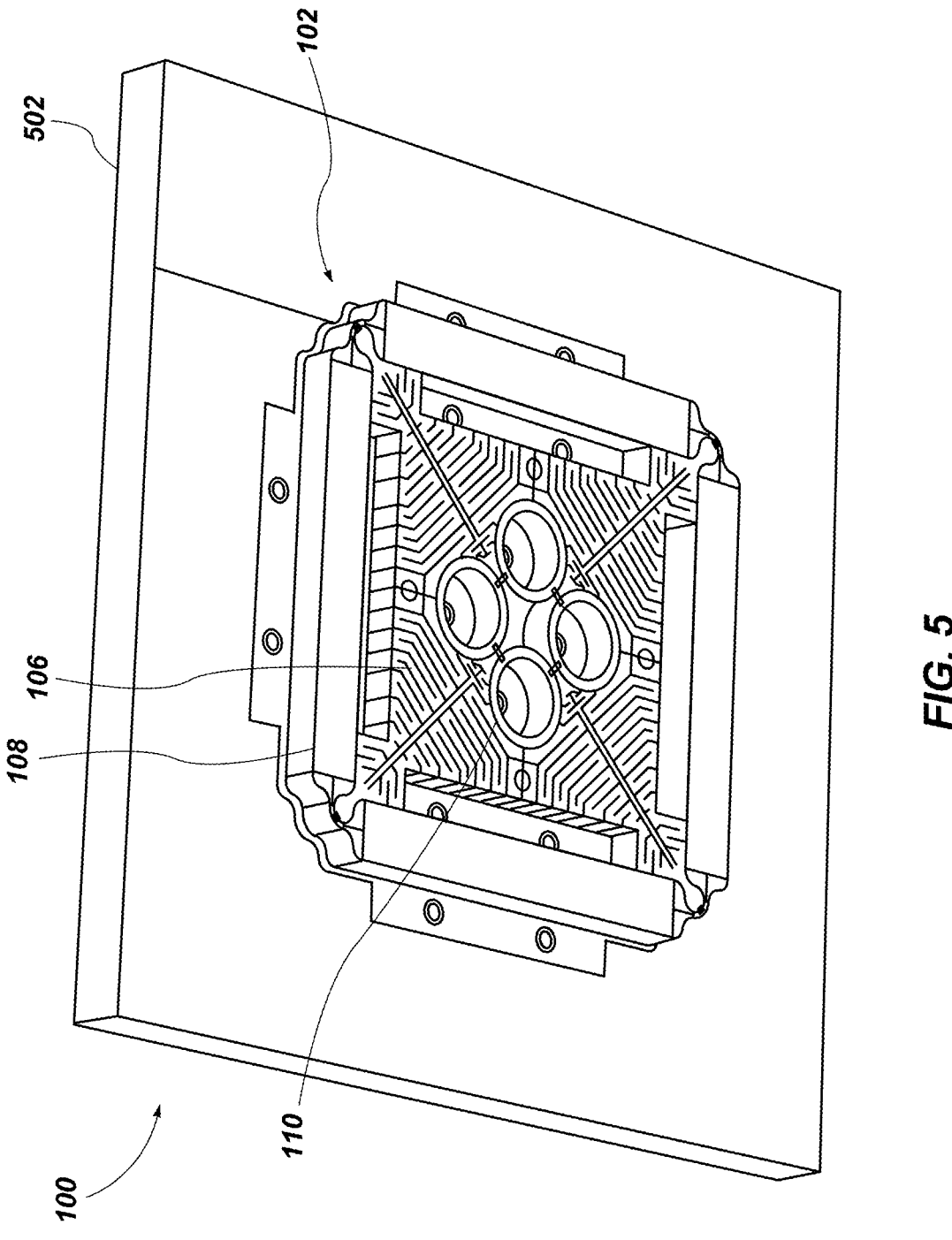
FIG. 5 is another perspective view of the apparatus of FIG. 2, further illustrating a cap portion attached to the dual resonator structure, according to one or more examples.

FIG. 5 is another perspective view of apparatus 100, to further illustrate a cap portion 502 (e.g., a silicon layer, such as polysilicon) attached to the dual resonator structure, according to one or more examples. Cap portion 502 may assist the structure in creating an isolating environment (e.g., a pressurized cavity, without limitation) in apparatus 100. An isolated environment provides for more consistent performance of apparatus 100.

Figures 6A, 6B:
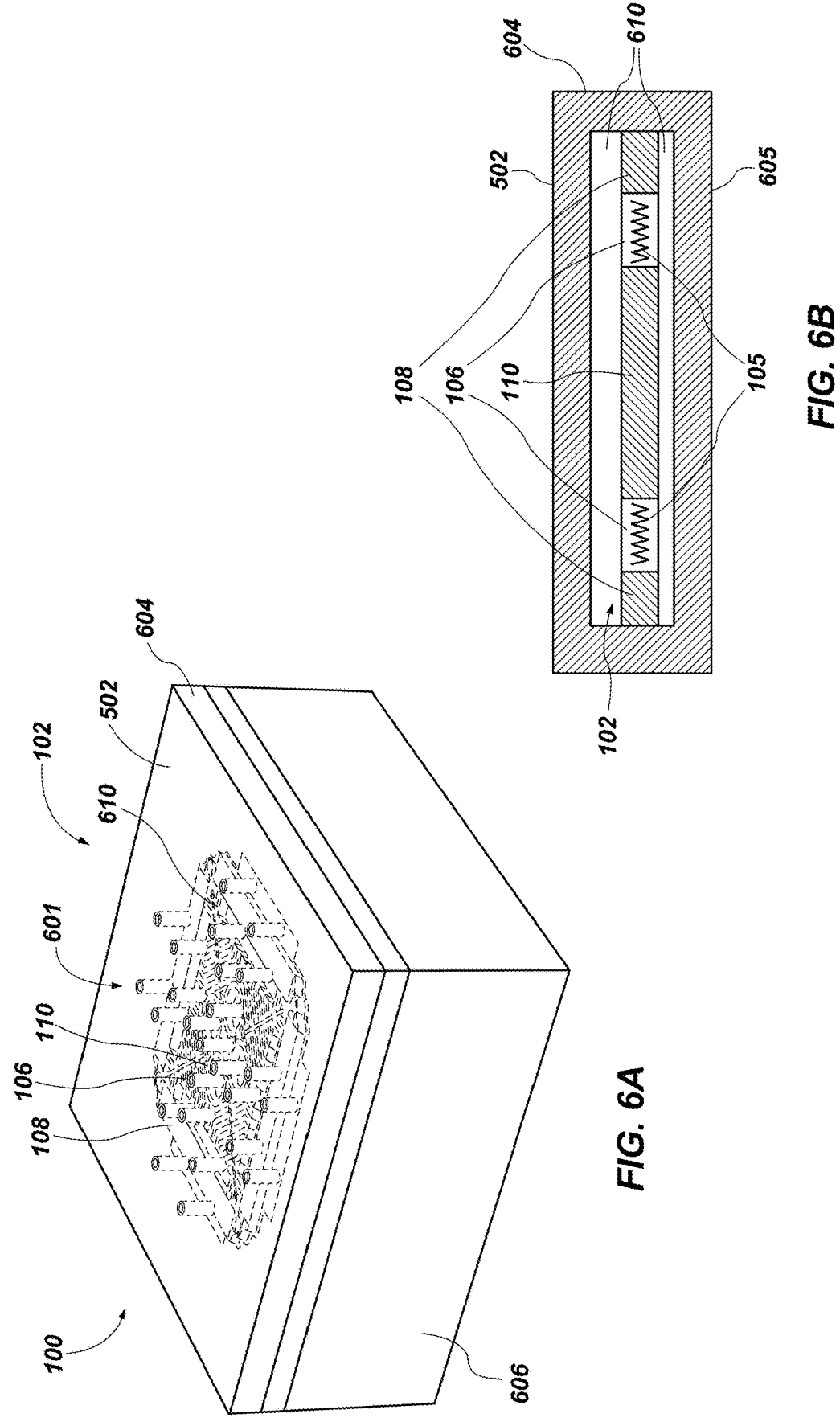
FIG. 6A is a perspective, partially transparent view of the apparatus, further illustrating a thermally-insulating enclosure that forms a cavity of an oven within which the dual resonator structure may be contained, according to one or more examples.
FIG. 6B is a simplified, partial cross-sectional view of the apparatus, further illustrating the dual resonator structure within the cavity of the oven.

FIG. 6A is a perspective, partially transparent view of apparatus 100, to further illustrate a thermally-insulating enclosure 604 that forms a cavity 610 (e.g., a sealed and/or vacuum cavity, without limitation) within which the dual resonator structure may be contained, according to one or more examples. Cap portion 502 may form at least part of thermally-insulating enclosure 604 of the oven that heats the dual resonator structure. Also illustrated in FIG. 6A are multiple conductive vias 601 that provide drive signals to, and receive sense signals from, first and second resonators 108 and 110, as well as to control the temperature of the dual resonator structure. In one or more examples, thermally-insulating enclosure 604 may also comprise a surface 605 in contact with a base 606 that supports thermally-insulating enclosure 604. In one or more alternative examples, base 606 may be or function as a heat sink of apparatus 100. Here, base 606 may serve as a passive heat exchanger that transfers heat of the oven to another (e.g., air) medium, to dissipate the heat away from the structure.

FIG. 6B is a simplified, partial cross-sectional view of the apparatus, further illustrating the dual resonator structure within cavity 610 of the oven, according to one or more examples. Cavity 610 may be a space above and below the dual resonator structure, or alternatively only above or only below the dual resonator structure. In one or more examples, the dual resonator structure is very small and thermally isolated in thermally-insulating enclosure 604, so that the heat required to maintain the predetermined temperature is relatively small when compared to other systems that require heat. In one or more examples, heat dissipation is substantially reduced with use of thermally-insulating enclosure 604.

Figures 7A, 7B:
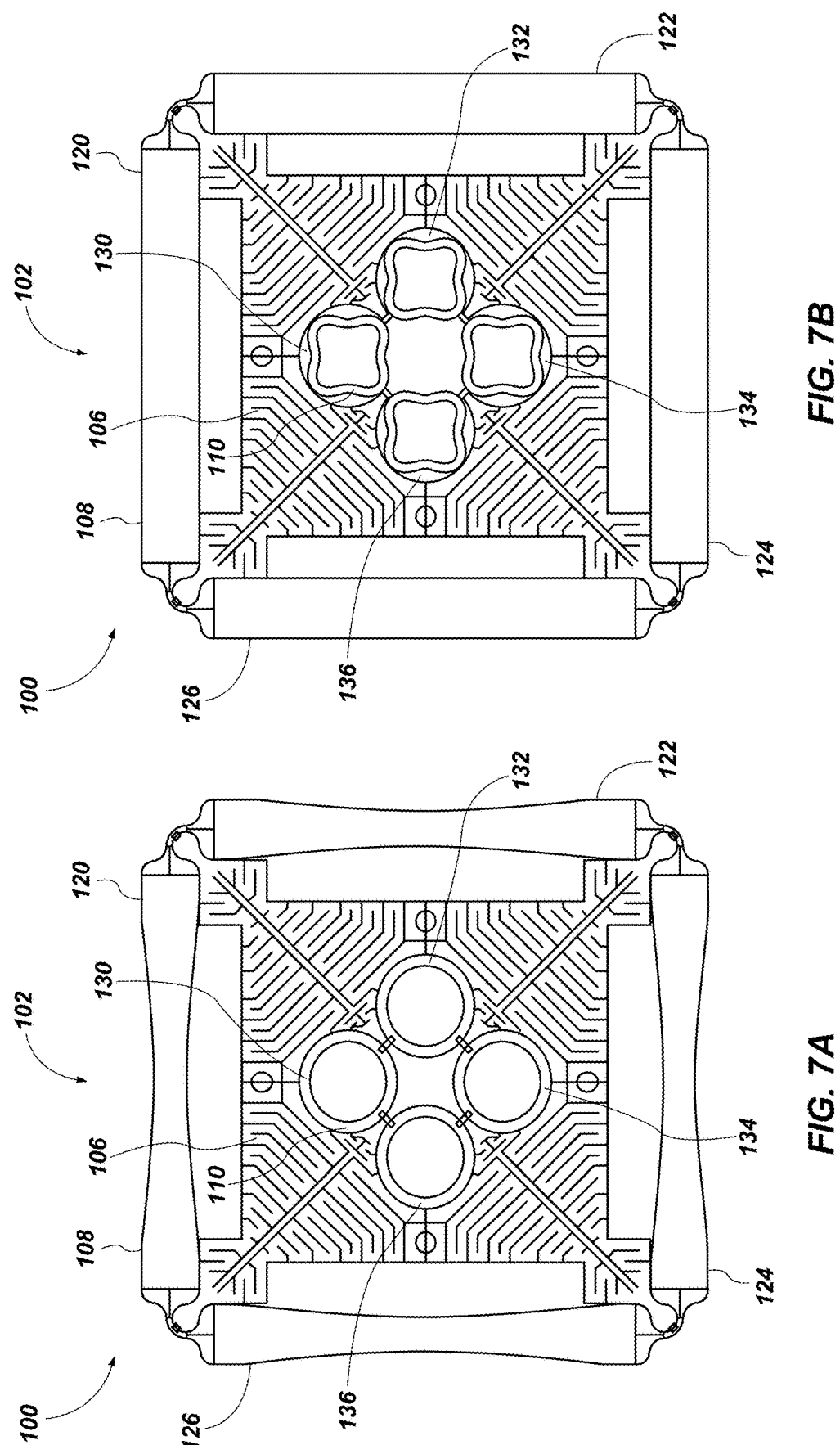
FIG. 7A is a top-down view of the apparatus, illustrating a first vibrating or resonating state of the first resonator that results in a corresponding first acoustic wave propagation, according to one or more examples.
FIG. 7B is a top-down view of the apparatus, illustrating a second vibrating or resonating state of the second resonator that results in a corresponding second acoustic wave propagation, according to one or more examples.

FIG. 7A is a top-down view of apparatus 100, illustrating a first vibrating or resonating state of first resonator 108 in a width extension mode (WEM), resulting in a corresponding first acoustic wave propagation. In FIG. 7A, when resonating in response to a drive signal, respective mid sections of the beams (e.g., beams 120, 122, 124, and 126, without limitation) expand and contract. In one or more examples, for first resonator 108 operating at $f_0$=120 MHz, $W_r$=30 μm, $L_r$=210 μm, and $W_c$=3 μm, wherein $W_r$ is the resonator beam width, $L_r$ is the resonator beam length, and $W_c$ is the width of the coupling beam.

FIG. 7B is a top-down view of apparatus 100, illustrating a second vibrating or resonating state of second resonator 110 in a breath mode of vibration, resulting in a corresponding second acoustic wave propagation. In FIG. 7B, when resonating in response to a drive signal, respective quarter sections of the rings (e.g., rings 130, 132, 134, and 136, without limitation) expand and contract. In one or more examples, for second resonator 110 operating at $f_0$=56 MHz, $R_o$=25 μm, $R_i$=20 μm, and $L_c$=3.6 μm, wherein $R_o$ is the outer radius of the ring, $R_i$ is the inner radius of the ring, and $L_c$ is the length of the coupling beam.

Figure 8A:
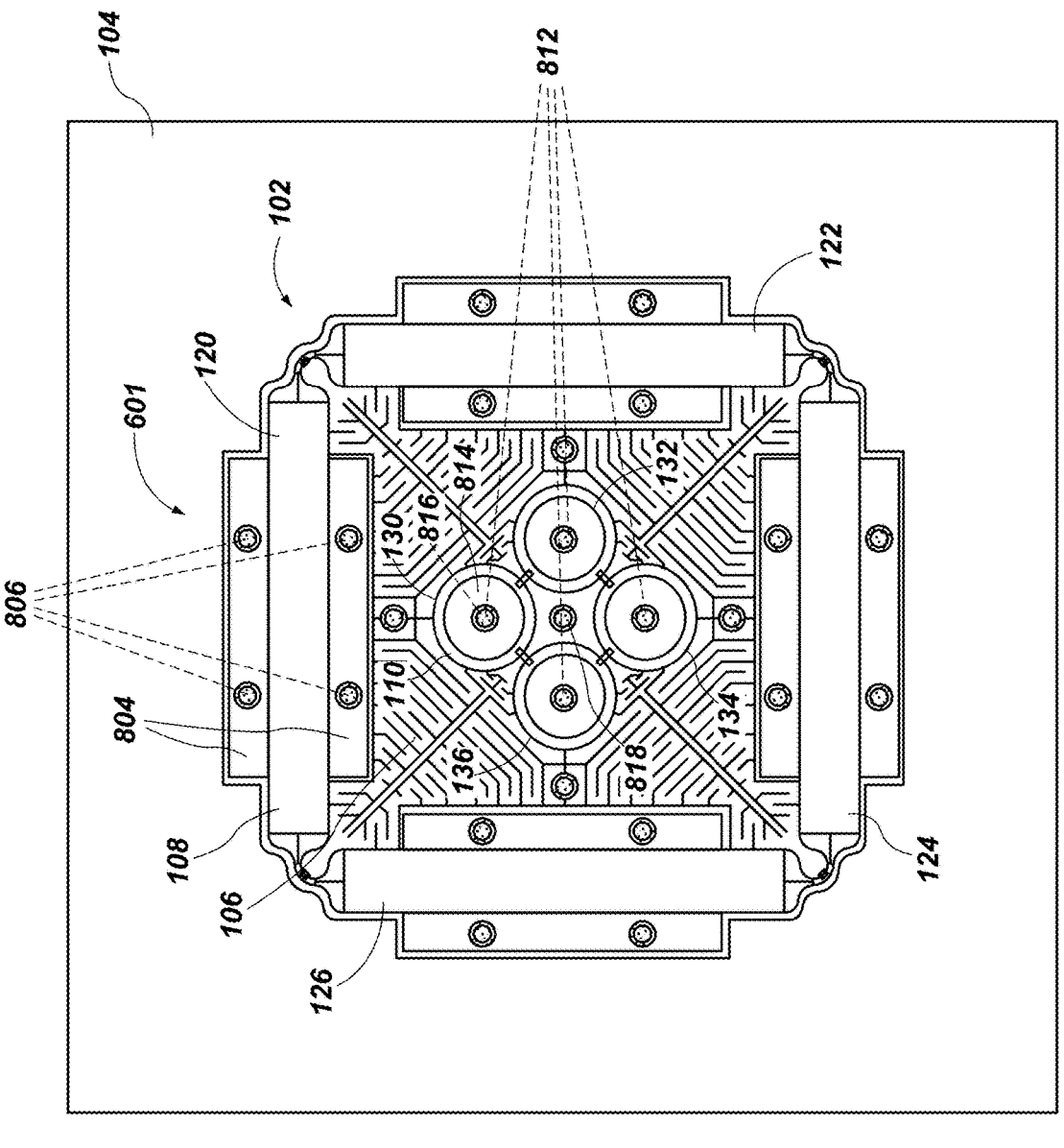
FIG. 8A is a top-down view of a schematic layout of the apparatus, further indicating multiple conductive vias used to send drive signals to, and receive sense signals from, the first and the second resonators.

FIG. 8A is a top-down view of a schematic layout of apparatus 100 of FIG. 2, further indicating multiple conductive vias 601 used to send drive signals to, and receive sense signals from, first and second resonators 108 and 110, according to one or more examples. Apparatus 100 of FIG. 8A includes a center conductive via 818 disposed at substantially (i.e., not exactly, without limitation) the cartesian center of apparatus 100.

For first resonator 108 (the multi-beam resonator, without limitation), electrode materials of multiple electrodes of beams 120, 122, 124, and 126 are disposed along adjacent sides of respective ones of beams 120, 122, 124, and 126. For example, beam 120 includes electrode materials 804 of multiple electrodes disposed along adjacent sides of beam 120. Drive signals may be sent to, and sense signals may be received from, beam 120 to/from electrode materials 804 via multiple conductive vias 806. In the example shown in FIG. 8A, there are four (4) conductive vias associated with respective ones of beams 120, 122, 124, and 126; specifically, two (2) conductive vias on each side of respective ones of beams 120, 122, 124, and 126.

For second resonator 110 (the multi-ring resonator, without limitation), electrode materials of multiple electrodes of rings 130, 132, 134, and 136 are disposed within (and, e.g., outside of) respective ones of rings 130, 132, 134, and 136. Multiple conductive vias 812 may be used to send drive signals to, and/or receive sense signals from, the electrode materials of the multiple electrodes of rings 130, 132, 134, and 136. For example, ring 130 includes electrode materials 814 of an electrode(s) disposed within (and, e.g., outside of) ring 130; drive signals may be sent to ring 130 to/from electrode materials 814 via a conductive via 816.

Figure 8B:
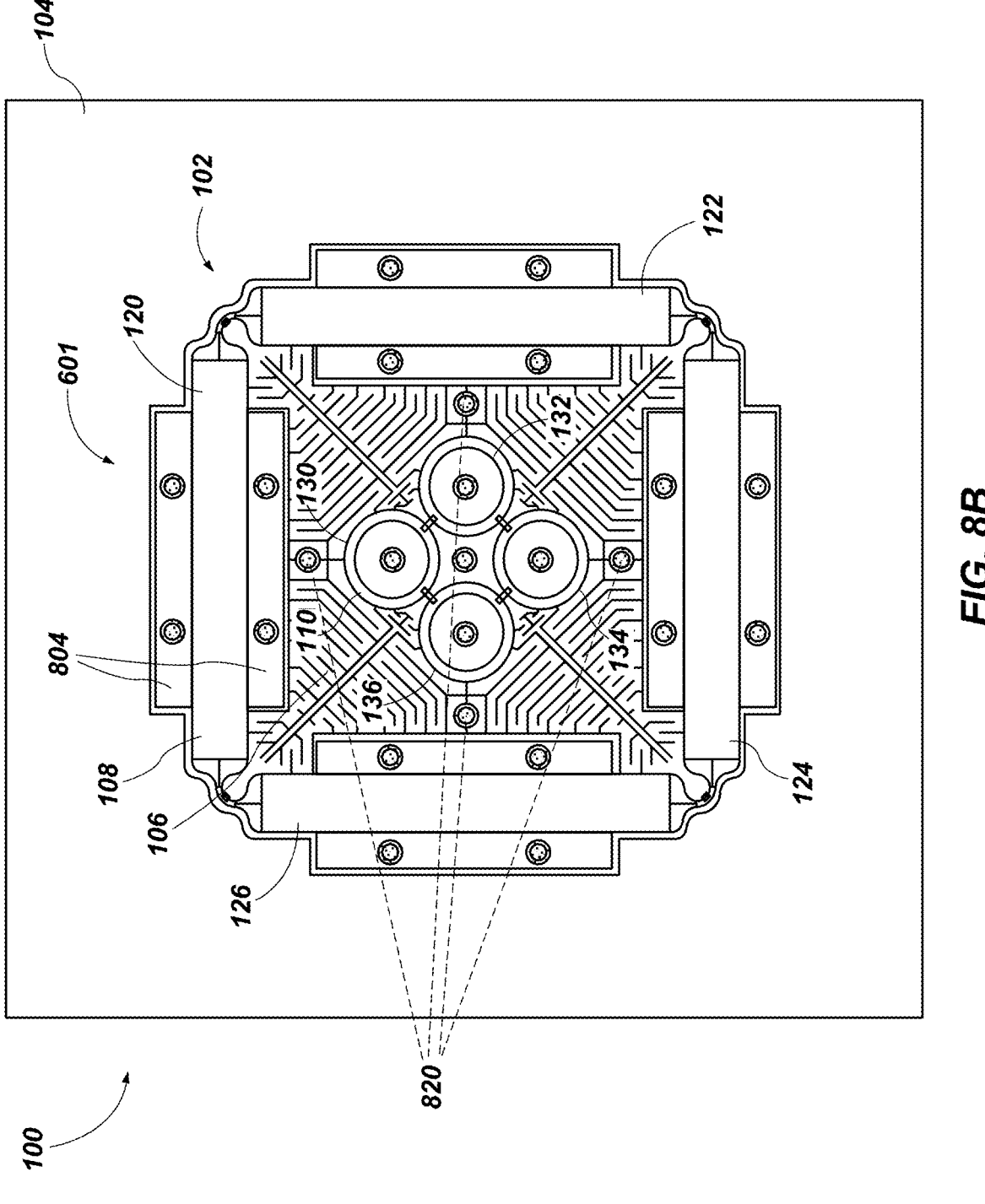
FIG. 8B is a top-down view of the schematic layout of the apparatus, further indicating multiple conductive vias (or electric power terminals) to one or more heating elements of the supporting portion, according to one or more examples.

FIG. 8B is a top-down view of the schematic layout of apparatus 100 of FIG. 2, further indicating multiple conductive vias 820 (or electric power terminals) to the one or more heating elements of supporting portion 106, according to one or more examples. Multiple conductive vias 820 may provide power to the one or more heating elements of supporting portion 106 (shown and described in relation to FIG. 9).

Figure 9:
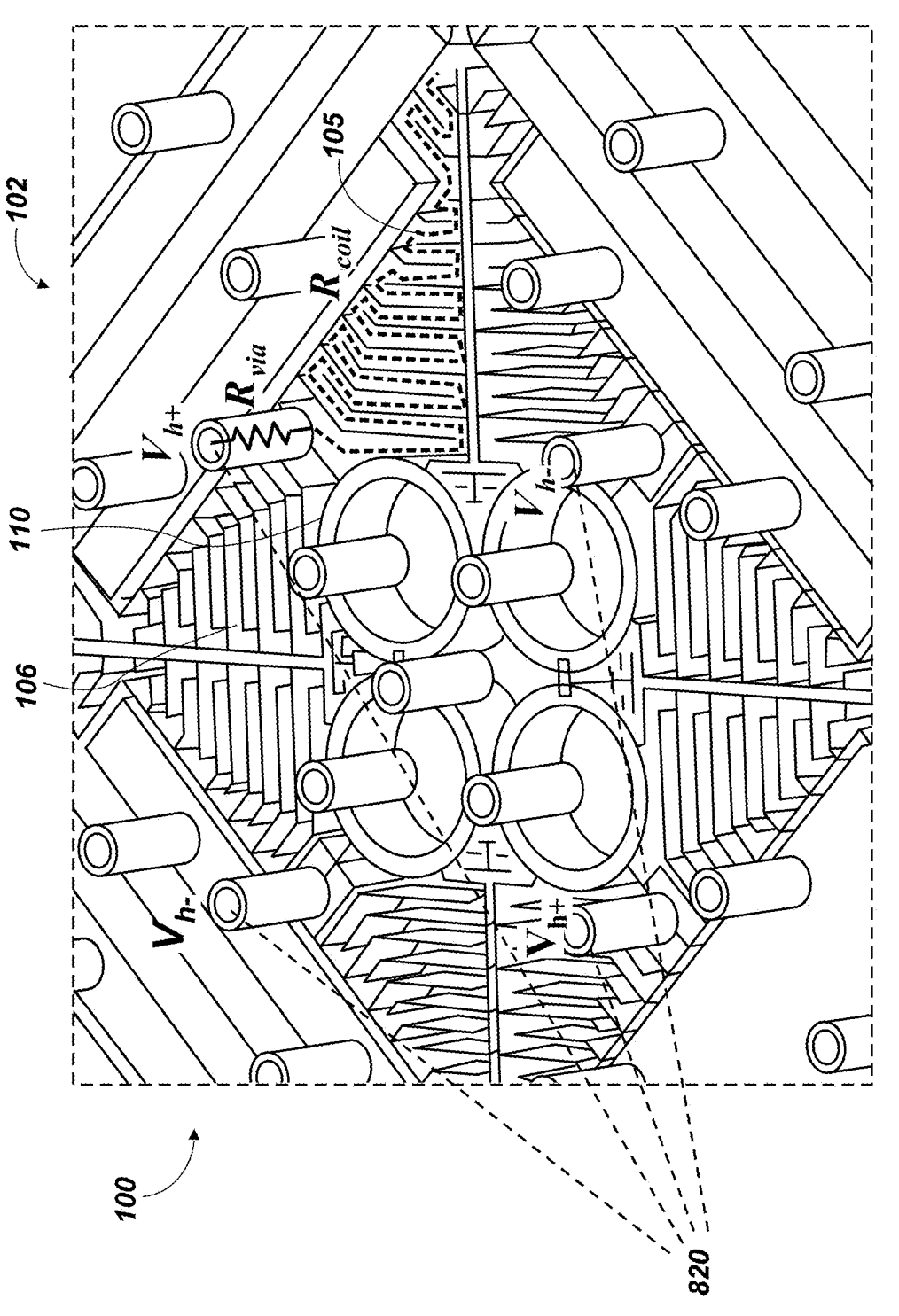
FIG. 9 is a perspective view of a portion of the apparatus of FIGS. 8A and 8B, further indicating multiple conductive vias (or electric power terminals) to the one or more heating elements, according to one or more examples.

FIG. 9 is a perspective view of a portion of apparatus 100 of FIGS. 8A and 8B, further indicating multiple conductive vias 820 (or electric power terminals) to one or more heating elements 105, according to one or more examples. As shown in FIG. 9, in one or more examples, one or more heating elements 105 include multiple conductive traces or coils (e.g., represented by dashed lines along a portion of supporting portion 106, within slots or channels of supporting portion 106). In one or more examples, one or more heating elements 105 include electrically conductive material. In one or more examples, the multiple conductive traces or coils are embedded in supporting portion 106 (e.g., routed within slots or channels of supporting portion 106, or between multiple ridges of supporting portion 106). In one or more examples, multiple segments of conductive traces may be utilized for heating, where each segment is associated with two conductive vias, electrodes, or nodes ($V_{h+}$ and $V_{h-}$) for heating, as indicated in FIG. 9.

In FIG. 9, only a one-eighth portion of supporting portion 106 is shown to include conductive traces or coils for illustrative clarity. In one or more preferred examples, the remaining seven-eighth portions of supporting portion 106 also include conductive traces or coils (e.g., so that one or more heating elements 105 are evenly distributed on, or in, supporting portion 106). Note that the one or more heating elements and/or conductive traces or coils are not illustrated in the supporting portion in FIGS. 2, 4, 5, 6A, 7A, 7B, 8A, and 8B to more clearly illustrate the structural aspects of the dual resonator structure itself in those figures.

In one or more examples, multiple conductive vias 820 to the heater (FIGS. 8B and 9) also serve as anchors to support first and second resonators 108 and 110. Thus, first and second resonators 108 and 110 may be virtually floating and vibrating (e.g., within the thermally-insulating enclosure or vacuum cavity), anchored by supporting portion 106 using multiple conductive vias 820 as anchor points. In one or more examples, multiple conductive vias 820 to the heater include four (4) conductive vias.

Figure 10:
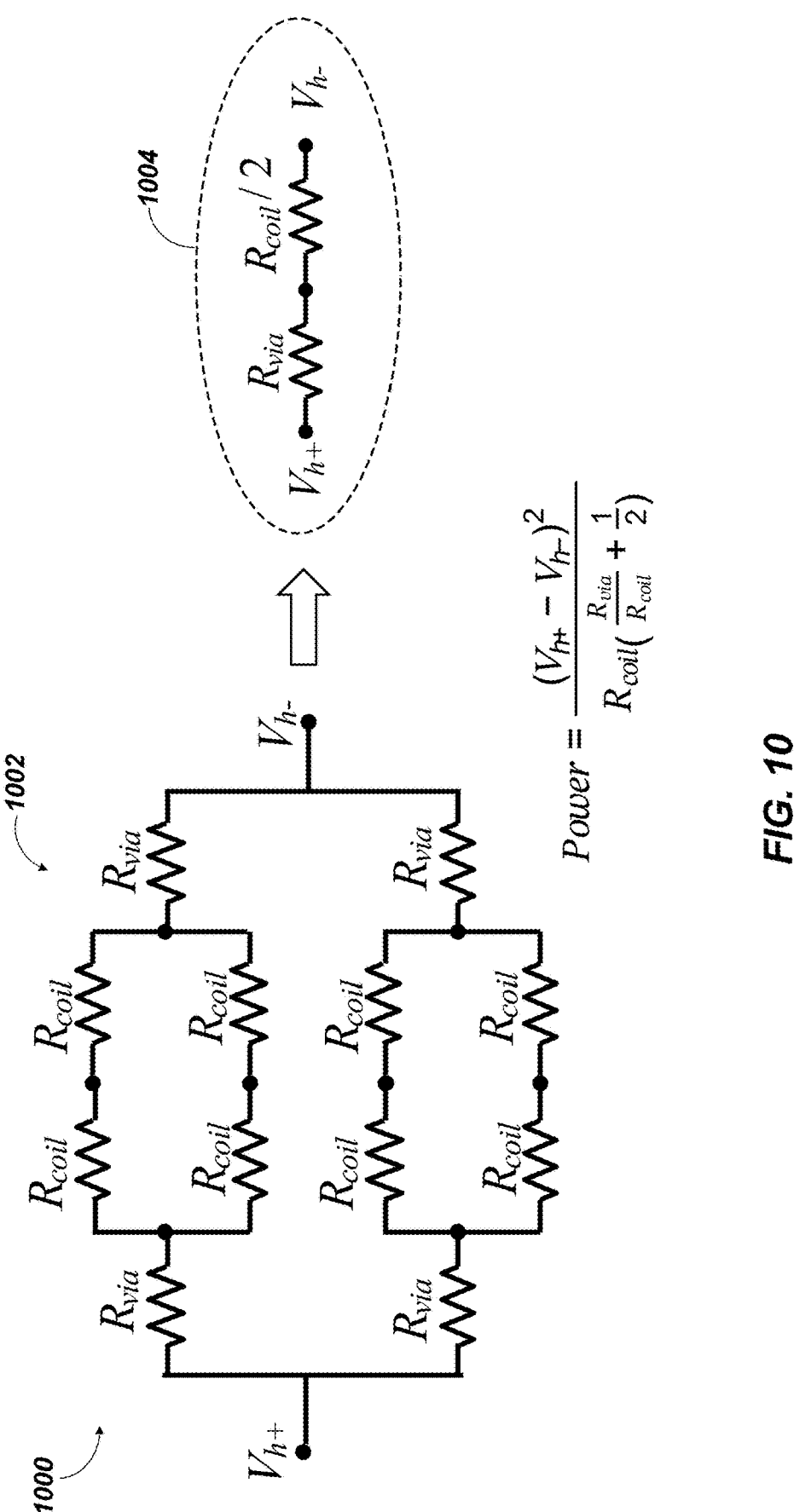
FIG. 10 is a schematic circuit representation of a specific example configuration of heating elements for heating the dual resonator structure, according to one or more examples.

FIG. 10 is a schematic circuit representation 1000 of a specific example configuration of heating elements 1002 for heating the dual resonator structure, according to one or more examples. Schematic circuit representation 1000 may be used for calculating power consumption, heat, and/or the appropriate voltage to and/or current through heating elements 1002 for controlling the heat of the dual resonator structure. In one or more examples, heating elements 1002 include multiple conductive traces or coils, multiple conductive vias, or both. Respective heating elements 1002 are represented as resistors (e.g., $R_{coil}$ and $R_{via}$) coupled as shown in the configuration of FIG. 10. Power and/or power dissipated may be determined based on the voltages ($V_{h+}$ and $V_{h-}$) applied to the nodes of the heating elements (e.g., $R_{coil}$ and $R_{via}$). A reduced schematic circuit representation 1004 of schematic circuit representation 1000 is also indicated in FIG. 10. In one or more examples, via layer doping is n=7e19, via layer thickness is 30 μm, device layer doping is n=7e19, device layer thickness=20 μm, $R_{via}$=7.4 ohms, $R_{via}$+$R_{coil}$/2=31.5 ohms, and $R_{coil}$=48.2 ohms.

Figure 11:
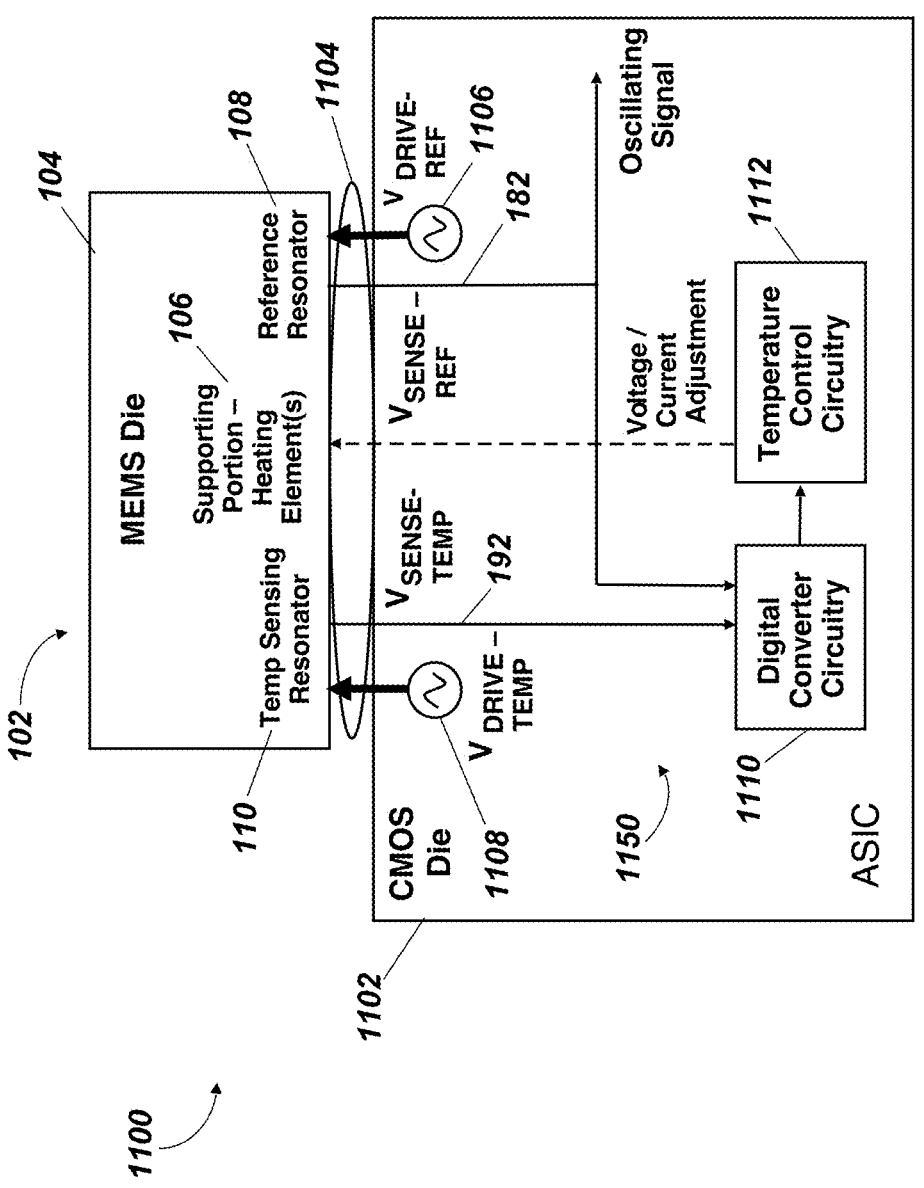
FIG. 11 is a schematic block diagram of an apparatus comprising a timing device or an oscillator (e.g., an oven-controlled MEMS oscillator, without limitation) including the dual resonator structure having the first resonator and the second resonator, according to one or more examples.

FIG. 11 is a block diagram of an apparatus 1100 comprising a timing device (e.g., an oscillator) including the dual resonator structure, according to one or more examples. In one or more examples, the oscillator of FIG. 11 is an oven-controlled MEMS oscillator (OCMO) to generate a timing signal or an oscillating signal having a frequency that is substantially stable over temperature. In one or more examples, apparatus 1100 comprising the oscillator having the dual resonator structure may replace (e.g., may be utilized instead of, without limitation) existing quartz-based oscillators such as crystal oscillators (XOs) or oven-controlled crystal oscillators (OCXOs).

Apparatus 1100 includes MEMS die 104 attached to a complementary metal-oxide semiconductor (CMOS) die 1102 via a die attachment 1104 (e.g., an epoxy or other, without limitation). As described earlier in relation to FIG. 1, MEMS die 104 includes semiconductor body 102 comprising first resonator 108 (e.g., the reference resonator, without limitation), second resonator 110 (e.g., the temperature-sensing resonator, without limitation), and supporting portion 106 including the one or more heating elements of the heater. CMOS die 1102 includes an electronic circuitry 1150 for producing a timing signal or oscillating signal with use of first resonator 108 and second resonator 110 on MEMS die 104.

Electronic circuitry 1150 includes a first drive circuitry 1106, a second drive circuitry 1108, a digital converter circuitry 1110, and a temperature control circuitry 1112. In one or more examples, electronic circuitry 1150 may be part of or included in an application-specific integrated circuit (ASIC). First drive circuitry 1106 generates a first drive signal to drive first resonator 108 via at least a first drive electrode. The first drive signal may be driven at a first drive frequency. Second drive circuitry 1108 generates a second drive signal to drive second resonator 110 via at least a second drive electrode. The second drive signal may be driven at a second drive frequency. In one or more examples, the second drive frequency is different from the first drive frequency.

In one or more examples, digital converter circuitry 1110 may be or include temperature-to-digital converter (TDC) circuitry. The TDC may provide a digital, very low-noise, high-resolution measurement of the temperature. Digital converter circuitry 1110 may receive first sense signal 182 from first resonator 108 via the at least one first sense electrode, and may convert sense signal 182 into first digital temperature data. First sense signal 182 has a first sense signal frequency, and the first digital temperature data represents a first temperature corresponding to the first sense signal frequency. Digital converter circuitry 1110 may receive second sense signal 192 from second resonator 110 via the at least one second sense electrode, and converts second sense signal 192 into second digital temperature data. Second sense signal 192 has a second sense signal frequency, and the second digital temperature data represents a second temperature corresponding to the second sense signal frequency.

Temperature control circuitry 1112 is used to control a voltage or current of the one or more heating elements to maintain a temperature of the dual resonator structure at a predetermined temperature (e.g., a turnover temperature, without limitation). Maintaining the temperature of the dual resonator structure at the predetermined temperature includes (e.g., regular) adjustments to the voltage or current of the one or more heating elements. The adjustments to the voltage or current are at least partially based on a ratio of changes in the first temperature of first resonator 108 and the second temperature of second resonator 110. Such a technique assists in maintaining frequency stability of the reference frequency.

Figure 12:
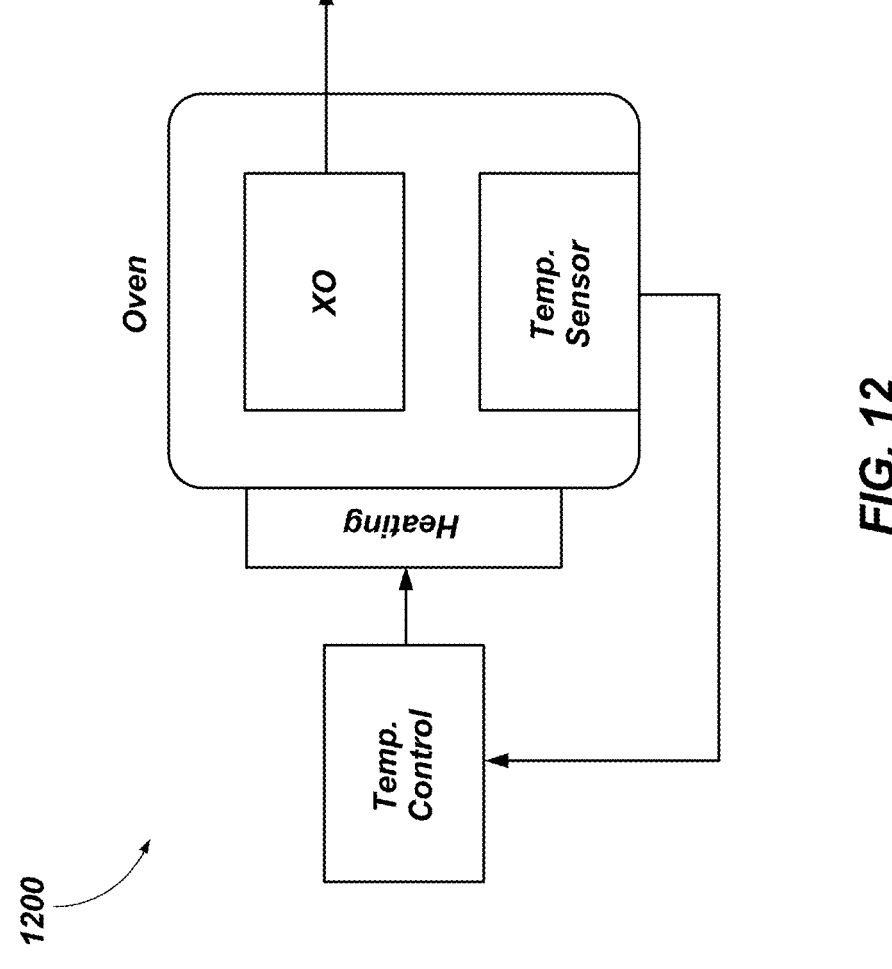
FIG. 12 is a block diagram of an oven-controlled crystal oscillator that is known to the inventor of this disclosure.

FIG. 12 is a block diagram of an oscillator 1200 that is known to the inventor of this disclosure. More particularly, oscillator 1200 of FIG. 12 is an oven-controlled crystal oscillator. Oscillator 1200 includes a crystal oscillator (XO) and a temperature sensor (e.g., a thermistor), which are contained in an oven. A temperature controller reads the temperature from the temperature sensor to control a heater to heat the oven.

In oscillator 1200 of FIG. 12, the crystal oscillator and the oven are relatively large in size, and a relatively high power is needed to maintain the oven at the operating temperature. There also exists a limited thermal coupling between the crystal oscillator and the temperature sensor. The temperature reading from the temperature sensor is largely correlated with the sensor itself, not with the crystal oscillator. Because a temperature offset exists between the crystal oscillator and the temperature sensor, the temperature reading and resulting adjustment may not be accurate. In addition, a thermal gradient that exists between the crystal oscillator and the temperature sensor causes their respective temperatures to be out-of-sync with each other, especially when undergoing relatively fast temperature transients. Because the crystal oscillator and the temperature sensor do not track equally, it is difficult to simultaneously read and correlate their respective temperatures. In addition, the temperature sensor may provide an analog output signal which may be relatively noisy and require use of an ADC. In some cases, the ADC may have a limited number of ADC bits which will undesirably limit the resolution of the temperature readout to result in adjustment inaccuracies.

Figures 13A, 13B:
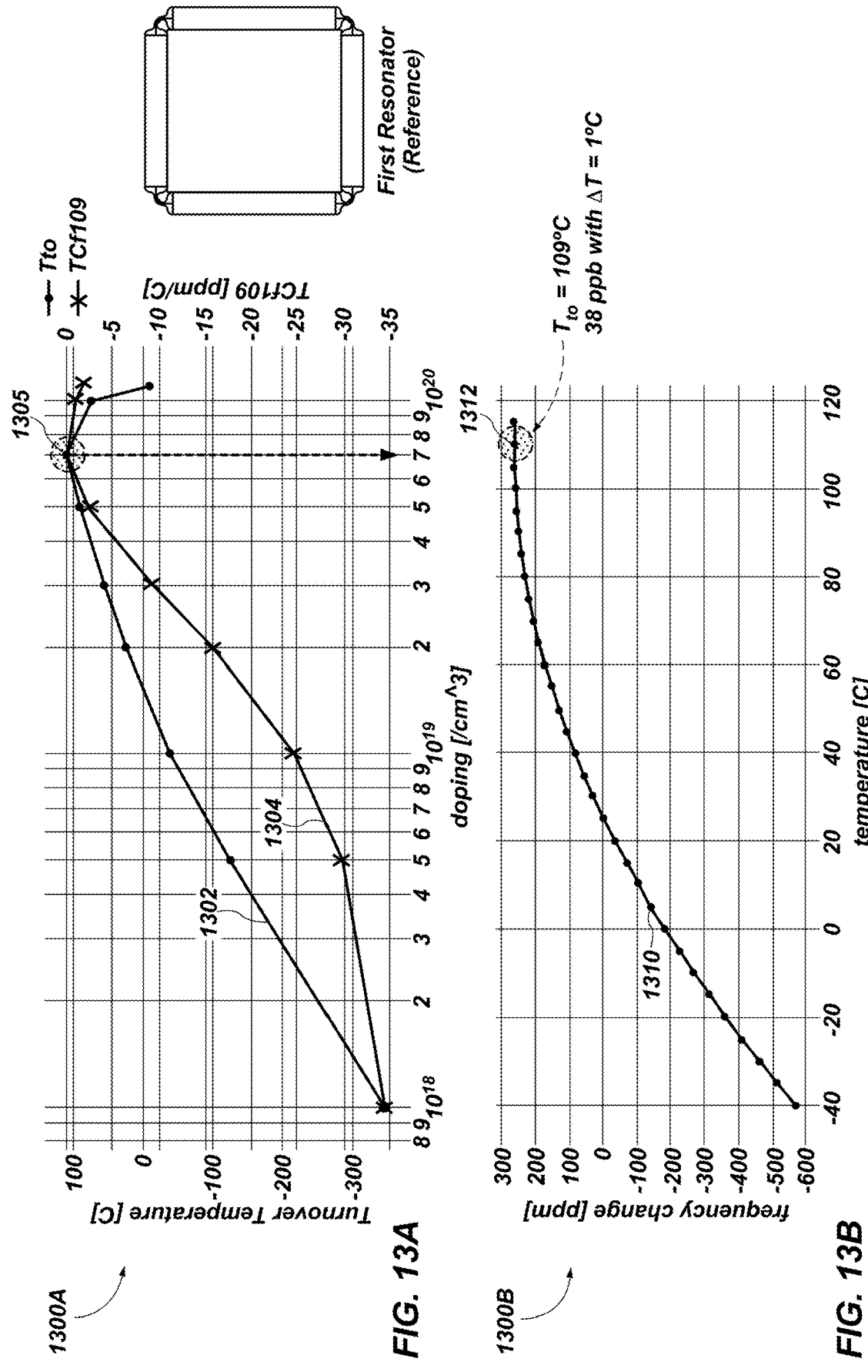
FIG. 13A is a graph of a first plot representing a relationship between turnover temperature and doping concentration for the first resonator (e.g., the reference resonator, without limitation), and a second plot representing a relationship between temperature coefficient of frequency (TCf) and the doping concentration for the first resonator, according to one or more examples.
FIG. 13B is a graph of a plot representing a relationship between frequency change and temperature for the first resonator, according to one or more examples.

FIG. 13A is a graph 1300A of a plot 1302 representing a relationship between turnover temperature and doping concentration for the first resonator (e.g., the reference resonator, without limitation), and a plot 1304 representing a relationship between a temperature coefficient of frequency (TCf) and the doping concentration for the first resonator, according to one or more examples. The turnover temperature is expressed in terms of degrees Celsius (C), the TCf is expressed in terms of parts-per-million (ppm) over degrees c. (ppm/C), and the doping concentration is expressed in terms of cubic centimeters ($cm^3$). In one or more examples, plots 1302 and 1304 characterize first resonator 108 (e.g., FIG. 2), which has a layout rotation of about 45° and a resonating (reference) frequency of 120 MHz, without limitation.

Along plot 1302 of FIG. 13A, one or more data points (e.g., a data point 1305, without limitation) correspond to a turnover temperature of about 109° C. The turnover temperature is the temperature at which the resonating frequency reaches a global maximum, and therefore the point at which the first resonator yields a minimum frequency variation with temperature. Typically, the turnover temperature is optimal when it is above, but still near, the highest temperature at which the first resonator can be operated. In one or more examples, the heater is used to maintain the temperature of the dual resonator structure at the turnover temperature, independent of the varying, external ambient temperature. In one or more examples, data point 1305 associated with the turnover temperature corresponds to a doping concentration of approximately −7e19 $cm^3$. Data point 1305 may be used to identify a corresponding point on plot 1304, and is the basis for the frequency change versus temperature plot of FIG. 13B.

FIG. 13B is a graph 1300B of a plot 1310 representing a relationship between frequency change and temperature for the first resonator (e.g., reference resonator, without limitation), according to one or more examples. In one or more examples, a predetermined temperature range for the first resonator (e.g., the ambient temperature range) as shown to be between about −40-120° C. At a data point 1312, the TCf is approximately zero (~0 ppm/° C.) at 110° C. (e.g., the turnover temperature), the target temperature at which to maintain the resonator. In FIG. 13B, the temperature variance (i.e., ΔT at the data point 1312) is 1° C., and the corresponding change or delta in frequency to this temperature variance is only about 38 parts-per-billion (ppb). As is apparent, the first resonator will exhibit a resonating frequency that is relatively frequency-stable (e.g., temperature insensitive, without limitation) over the predetermined temperature range.

Figures 14A, 14B:
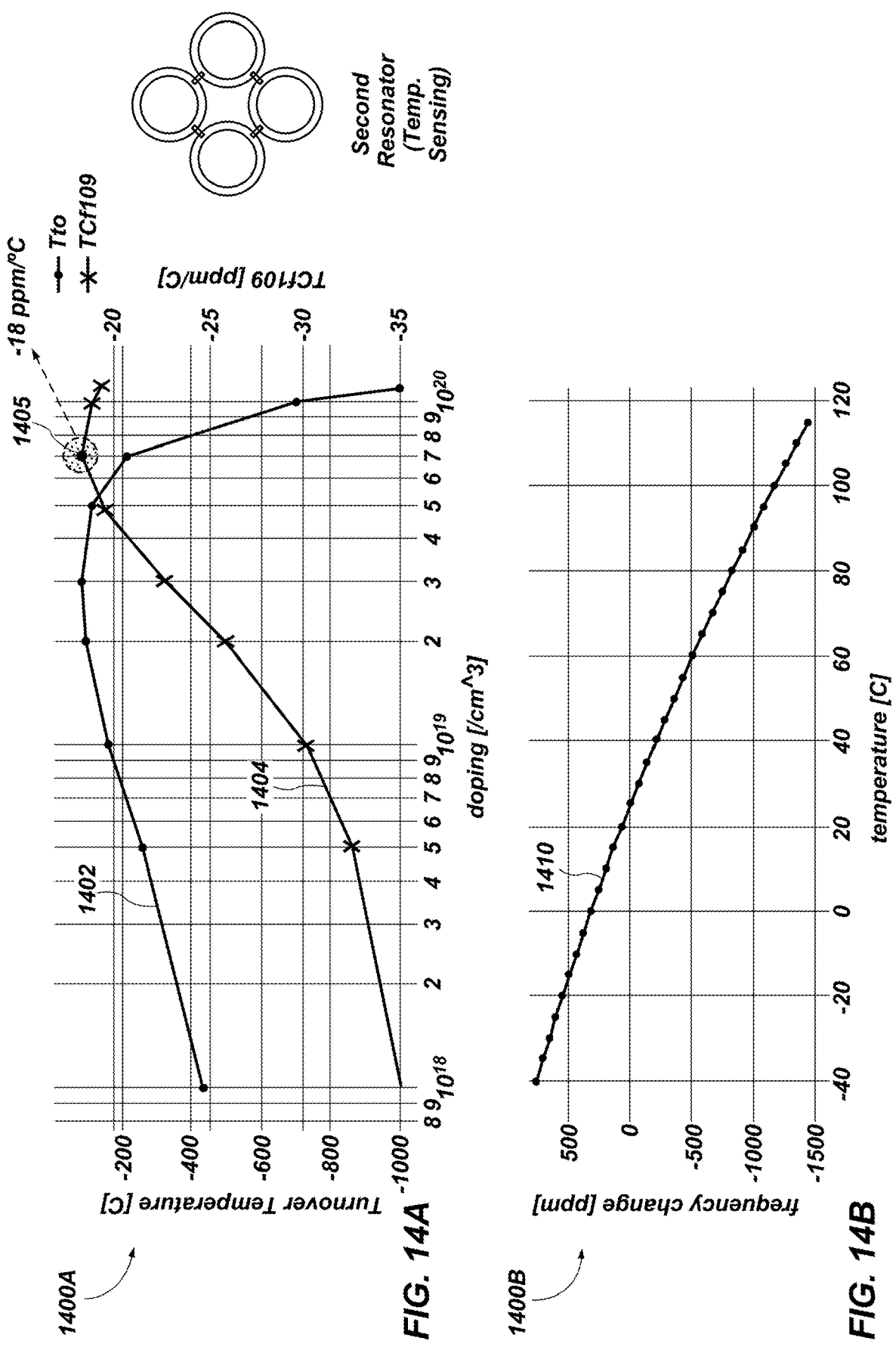
FIG. 14A is a graph of a first plot representing a relationship between turnover temperature and doping concentration for the second resonator (e.g., the temperature-sensing resonator, without limitation), and a second plot representing a relationship between frequency change and the doping concentration for the second resonator, according to one or more examples.
FIG. 14B is a graph of a plot representing a relationship between frequency change and temperature for the second resonator (e.g., the temperature-sensing resonator, without limitation), according to one or more examples.

FIG. 14A is a graph 1400A of a plot 1402 representing a relationship between turnover temperature and doping concentration for the second resonator (e.g., the temperature-sensing resonator, without limitation), and a plot 1404 representing a relationship between frequency change and the doping concentration for the second resonator, according to one or more examples. In one or more examples, plots 1402 and 1404 characterize second resonator 110 (FIG. 2), which has a layout rotation of about 45° and a resonating frequency of 56 MHz, without limitation. Along plot 1404 of FIG. 14A, one or more data points (e.g., a data point 1405, without limitation) correspond to the turnover temperature of the first resonator (e.g., about 109° C., FIG. 13A) as well as the doping concentration of approximately −7e19 $cm^3$. Data point 1405 is the basis for the frequency change versus temperature plot of FIG. 13B.

FIG. 14B is a graph 1400B of a plot 1410 representing a relationship between frequency change and temperature for the second resonator (e.g., temperature-sensing resonator, without limitation). For the second resonator, the TCf is about −18 ppm/° C. at 109° C. (i.e., the turnover temperature of the first resonator). As is apparent from plot 1410, the second resonator exhibits a resonating frequency that is relatively temperature-dependent (e.g., temperature sensitive, without limitation) over the predetermined temperature range. In one or more examples, the second resonator is to resonate at a resonating frequency that is generally linearly decreasing as temperature increases over the predetermined temperature range. In one or more examples, the frequency versus temperature profile of the second resonator may be defined by a linear function having a negative slope. In one or more alternative examples, the second resonator is to resonate at a resonating frequency that is generally linearly increasing as temperature increases over the predetermined temperature range.

Figure 15:
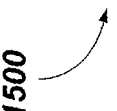
FIG. 15 is a graph of plots representing relationships between resonator temperature and power with use of a base (e.g., a heat sink), according to one or more examples.

FIG. 15 is a graph 1500 of plots 1502, 1504 representing relationships between resonator temperature and power with use of a base as a heat sink (e.g., base 606 of FIG. 6), according to one or more examples. In FIG. 15, plot 1502 is associated with an ambient temperature of 25° C. and plot 1504 is associated with an ambient temperature of −40° C.

Figure 16:
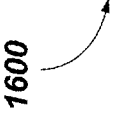
FIG. 16 is a graph of plots representing relationships between resonator temperature and power without use of a base (e.g., a heat sink), according to one or more examples.

FIG. 16 is a graph 1600 of plots 1602, 1604 representing relationships between resonator temperature and power without use of a base as a heat sink (e.g., base 606 of FIG. 6), according to one or more examples. In FIG. 16, plot 1602 is associated with an ambient temperature of 25° C. and plot 1604 is associated with an ambient temperature of −40° C.

As is apparent from FIGS. 15 and 16, power consumption in a poor or worst case scenario is less than 50 milliwatts (mW). In one or more examples, an apparatus comprising the dual resonator structure of the disclosure is configured without the base. In one or more examples, power consumption is reduced as a result of the apparatus configured without the base.

Figure 17:
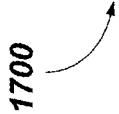
FIG. 17 is a graph of plots representing timing responses of the first and the second resonators, respectively, to reach the target or turnover temperature, according to one or more examples.

FIG. 17 is a graph 1700 of plots 1702, 1704 representing the timing responses of the first and the second resonators, respectively, to reach the target or turnover temperature, according to one or more examples. Here, the environmental temperature $T_{env}$=25° C. and $V_h$=+/−0.5 V (or 32 mW). As is apparent, the timing responses associated with the first and the second resonators are substantially the same. In one or more examples, there is a relatively fast response time (e.g., 27 ms) to reach the turnover temperature of 109° C. from room temperature using 32 mW of power.

Figure 18:
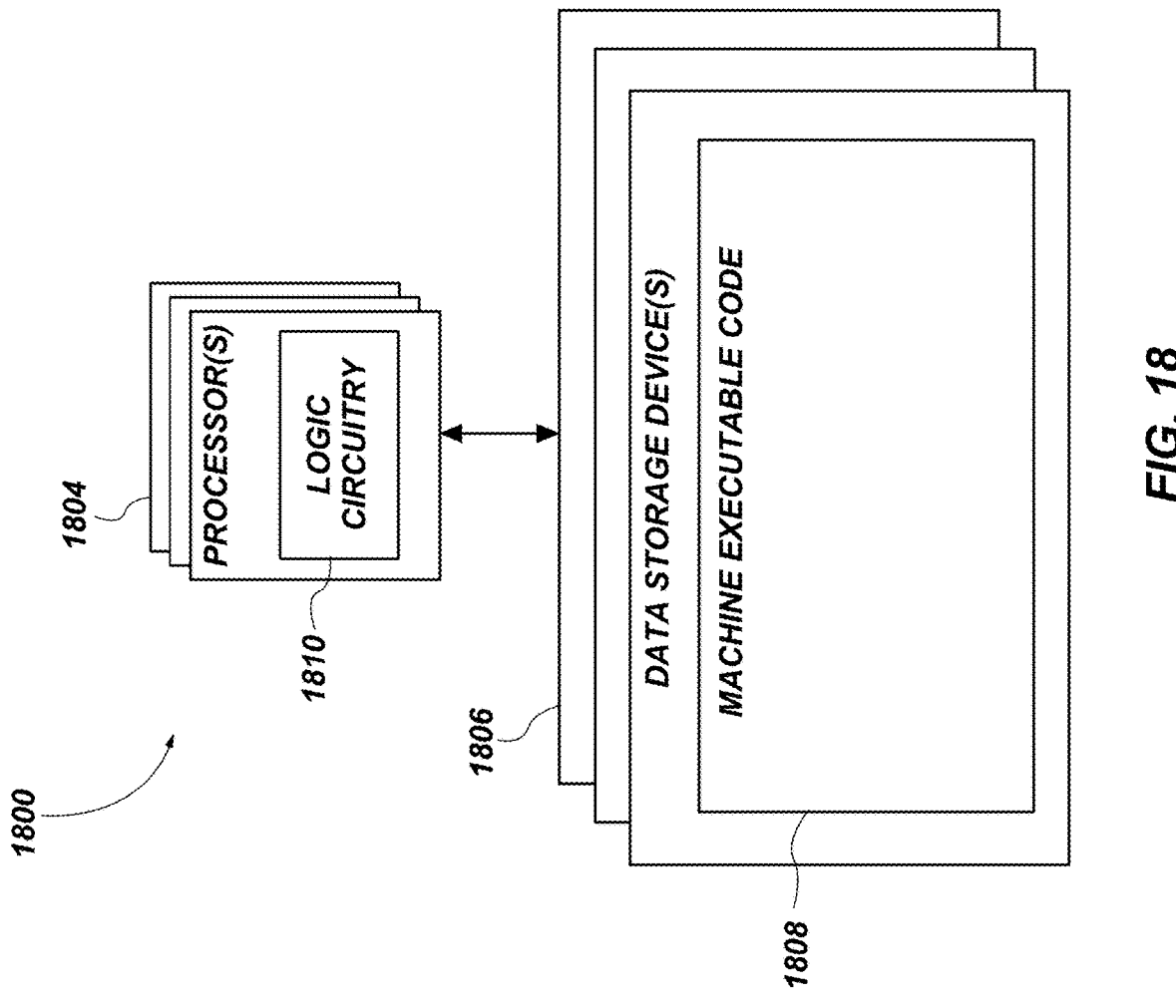
FIG. 18 is a block diagram of a device that, in one or more examples, may be used to implement various functions, operations, acts, processes, or methods disclosed herein.

FIG. 18 is a block diagram of a device 1800 that, in one or more examples, may be used to implement various functions, operations, acts, processes, or methods disclosed herein. Device 1800 includes one or more processors 1804 (sometimes referred to herein as "processors 1804") operably coupled to one or more apparatuses such as data storage devices (sometimes referred to herein as "storage 1806"), without limitation. Storage 1806 includes machine executable code 1808 stored thereon (e.g., stored on a computer-readable memory, without limitation) and processors 1804 include logic circuitry 1810. Machine executable code 1808 includes information describing functional elements that may be implemented by (e.g., performed by, without limitation) logic circuitry 1810. Logic circuitry 1810 implements (e.g., performs, without limitation) the functional elements described by machine executable code 1808. Device 1800, when executing the functional elements described by machine executable code 1808, should be considered as special purpose hardware which may carry out the functional elements disclosed herein. In one or more examples, processors 1804 may perform the functional elements described by machine executable code 1808 sequentially, concurrently (e.g., on one or more different hardware platforms, without limitation), or in one or more parallel process streams.

When implemented by logic circuitry 1810 of processors 1804, machine executable code 1808 may adapt processors 1804 to perform operations of examples disclosed herein. For example, machine executable code 1808 may adapt processors 1804 to perform at least a portion or a totality of the operations discussed in relation to electronic circuitry 1150 of FIG. 11, without limitation.

Processors 1804 may include a general purpose processor, a special purpose processor, a central processing unit (CPU), a microcontroller, a programmable logic controller (PLC), a digital signal processor (DSP), an application specific integrated circuit (ASIC), a field-programmable gate array (FPGA) or other programmable logic device, discrete gate or transistor logic, discrete hardware components, other programmable device, or any combination thereof designed to perform the functions disclosed herein. A general-purpose computer including a processor is considered a special-purpose computer while the general-purpose computer executes computing instructions (e.g., software code, without limitation) related to examples. It is noted that a general-purpose processor (may also be referred to herein as a host processor or simply a host) may be a microprocessor, but in the alternative, processors 1804 may include any conventional processor, controller, microcontroller, or state machine. Processors 1804 may also be implemented as a combination of computing devices, such as a combination of a DSP and a microprocessor, a plurality of microprocessors, one or more microprocessors in conjunction with a DSP core, or any other such configuration.

In one or more examples, storage 1806 includes volatile data storage (e.g., random-access memory (RAM), without limitation), non-volatile data storage (e.g., Flash memory, a hard disc drive, a solid state drive, erasable programmable read-only memory (EPROM), without limitation). In one or more examples, processors 1804 and storage 1806 may be implemented into a single device (e.g., a semiconductor device product, a system on chip (SOC), without limitation). In one or more examples, processors 1804 and storage 1806 may be implemented into separate devices.

In one or more examples, machine executable code 1808 may include computer-readable instructions (e.g., software code, firmware code, without limitation). By way of non-limiting example, the computer-readable instructions may be stored by storage 1806, accessed directly by processors 1804, and executed by processors 1804 using at least logic circuitry 1810. Also by way of non-limiting example, the computer-readable instructions may be stored on storage 1806, transmitted to a memory device (not shown) for execution, and executed by processors 1804 using at least logic circuitry 1810. Accordingly, in one or more examples, logic circuitry 1810 includes electrically configurable logic circuitry.

In one or more examples, machine executable code 1808 may describe hardware (e.g., circuitry, without limitation) to be implemented in logic circuitry 1810 to perform the functional elements. This hardware may be described at any of a variety of levels of abstraction, from low-level transistor layouts to high-level description languages. At a high-level of abstraction, a hardware description language (HDL) such as an Institute of Electrical and Electronics Engineers (IEEE) Standard hardware description language (HDL) may be used, without limitation. By way of non-limiting examples, VERILOG™, SYSTEMVERILOG™ or very large scale integration (VLSI) hardware description language (VHDL™) may be used.

HDL descriptions may be converted into descriptions at any of numerous other levels of abstraction as desired. As a non-limiting example, a high-level description can be converted to a logic-level description such as a register-transfer language (RTL), a gate-level (GL) description, a layout-level description, or a mask-level description. As a non-limiting example, micro-operations to be performed by hardware logic circuits (e.g., gates, flip-flops, registers, without limitation) of logic circuitry 1810 may be described in an RTL and then converted by a synthesis tool into a GL description, and the GL description may be converted by a placement and routing tool into a layout-level description that corresponds to a physical layout of an integrated circuit of a programmable logic device, discrete gate or transistor logic, discrete hardware components, or combinations thereof. Accordingly, in one or more examples, machine executable code 1808 may include an HDL, an RTL, a GL description, a mask level description, other hardware description, or any combination thereof.

In examples where machine executable code 1808 includes a hardware description (at any level of abstraction), a system (not shown, but including storage 1806) may implement the hardware description described by machine executable code 1808. By way of non-limiting example, processors 1804 may include a programmable logic device (e.g., an FPGA or a PLC, without limitation) and the logic circuitry 1810 may be electrically controlled to implement circuitry corresponding to the hardware description into logic circuitry 1810. Also by way of non-limiting example, logic circuitry 1810 may include hard-wired logic manufactured by a manufacturing system (not shown, but including storage 1806) according to the hardware description of machine executable code 1808.

Regardless of whether machine executable code 1808 includes computer-readable instructions or a hardware description, logic circuitry 1810 performs the functional elements described by machine executable code 1808 when implementing the functional elements of machine executable code 1808. It is noted that although a hardware description may not directly describe functional elements, a hardware description indirectly describes functional elements that the hardware elements described by the hardware description are capable of performing.

As used herein, the term "substantially" in reference to a given parameter, property, or condition means and includes to a degree that one skilled in the art would understand that the given parameter, property, or condition is met with a small degree of variance, such as within acceptable manufacturing tolerances. For example, a parameter that is substantially met may be at least about 90% met, at least about 95% met, or even at least about 99% met.

As used in the present disclosure, the terms "module" or "component" may refer to specific hardware implementations may perform the actions of the module or component or software objects or software routines that may be stored on or executed by general purpose hardware (e.g., computer-readable media, processing devices, without limitation) of the computing system. In one or more examples, the different components, modules, engines, and services described in the present disclosure may be implemented as objects or processes that execute on the computing system (e.g., as separate threads, without limitation). While some of the system and methods described in the present disclosure are generally described as being implemented in software (stored on or executed by general purpose hardware), specific hardware implementations or a combination of software and specific hardware implementations are also possible and contemplated.

As used in the present disclosure, the term "combination" with reference to a plurality of elements may include a combination of all the elements or any of various different sub-combinations of some of the elements. For example, the phrase "A, B, C, D, or combinations thereof" may refer to any one of A, B, C, or D; the combination of each of A, B, C, and D; and any sub-combination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," without limitation). As used herein, "each" means "some or a totality." As used herein, "each and every" means "a totality."

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" or "an" means "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, without limitation" or "one or more of A, B, and C, without limitation." is used, in general such a construction is intended to include A alone, B alone, C alone, A and B together, A and C together, B and C together, or A, B, and C together, without limitation.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated examples, those of ordinary skill in the art will recognize and appreciate that the present invention is not so limited. Rather, many additions, deletions, and modifications to the illustrated and described examples may be made without departing from the scope of the invention as hereinafter claimed along with their legal equivalents. In addition, features from one example may be combined with features of another example while still being encompassed within the scope of the invention as contemplated by the inventor.

A non-exhaustive, non-limiting list of examples follows. Not each of the examples listed below is explicitly and individually indicated as being combinable with all others of the examples listed below and examples discussed above. It is intended, however, that these examples are combinable with all other examples unless it would be apparent to one of ordinary skill in the art that the examples are not combinable.

Example 1: An apparatus comprising: a microelectromechanical system (MEMS) including a semiconductor body, the semiconductor body comprising: a first resonator, the first resonator to resonate at a first resonating frequency that is generally frequency-stable over a predetermined temperature range; a second resonator, the second resonator to resonate at a second resonating frequency that is generally linearly decreasing or increasing as temperature increases over the predetermined temperature range; a supporting portion, the supporting portion to support both the first resonator and the second resonator; and one or more heating elements of a heater on, or in, the supporting portion.

Example 2: The apparatus according to Example 1, comprising: a thermally-insulating enclosure of an oven, the thermally-insulating enclosure containing the first resonator, the second resonator, and the supporting portion including the one or more heating elements of the heater.

Example 3: The apparatus according to Examples 1 and 2, wherein the apparatus comprises an oven-controlled MEMS timing device.

Example 4: The apparatus according to any of Examples 1 to 3, wherein: the first resonator has a first temperature coefficient of frequency, and the second resonator has a second temperature coefficient of frequency, the second temperature coefficient of frequency different from the first temperature coefficient of frequency.

Example 5: The apparatus according to any of Examples 1 to 4, wherein: the first resonator comprises a reference resonator; the second resonator comprises a temperature-sensing resonator; and the supporting portion mechanically and thermally couples the first resonator and the second resonator.

Example 6: The apparatus according to any of Examples 1 to 5, wherein the second resonator to resonate at a second resonating frequency that is generally linearly decreasing as temperature increases over the predetermined temperature range.

Example 7: The apparatus according to any of Examples 1 to 6, wherein the semiconductor body comprises: at least one first drive electrode of the first resonator; at least one first sense electrode of the first resonator; at least one second drive electrode of the second resonator; and at least one second sense electrode of the second resonator.

Example 8: The apparatus according to any of Examples 1 to 7, comprising: at least first and second conductive vias coupled to the one or more heating elements.

Example 9: The apparatus according to any of Examples 1 to 8, wherein: the first resonator comprises an outer portion of the semiconductor body, and the second resonator comprises a central portion of the semiconductor body.

Example 10: The apparatus according to any of Examples 1 to 9, wherein: the first resonator comprises a multi-beam resonator, and the second resonator comprises a multi-ring resonator.

Example 11: The apparatus according to any of Examples 1 to 10, wherein the semiconductor body comprises a single crystal silicon.

Example 12: The apparatus according to any of Examples 1 to 11, comprising: a single die comprising the semiconductor body.

Example 13: An apparatus comprising: an oven-controlled microelectromechanical system (MEMS) timing device comprising: a microelectromechanical system including a semiconductor body, the semiconductor body comprising: a first resonator, the first resonator to resonate at a first resonating frequency that is generally frequency-stable over a predetermined temperature range; at least one first drive electrode of the first resonator; at least one first sense electrode of the first resonator; a second resonator, the second resonator to resonate at a second resonating frequency that is generally linearly decreasing or increasing as temperature increases over the predetermined temperature range; at least one second drive electrode of the second resonator; at least one second sense electrode of the second resonator; a supporting portion to support both the first resonator and the second resonator; and one or more heating elements of a heater on, or in, the supporting portion.

Example 14: The apparatus according to Example 13, comprising: a thermally-insulating enclosure of an oven, the thermally-insulating enclosure containing the first resonator, the second resonator, and the supporting portion including the one or more heating elements of the heater.

Example 15: The apparatus according to Examples 13 and 14, comprising: at least first and second conductive vias coupled to the one or more heating elements of the heater.

Example 16: The apparatus according to any of Examples 13 to 15, wherein the microelectromechanical system is on a first die, the apparatus comprising: the oven-controlled MEMS timing device comprising: an electronic circuitry, the electronic circuitry on a second die attached to the first die, the electronic circuitry comprising: a first drive circuitry, the first drive circuitry to generate a first drive signal to drive the first resonator via the at least one first drive electrode, the first drive signal having a first drive frequency; a second drive circuitry, the second drive circuitry to generate a second drive signal to drive the second resonator via the at least one second drive electrode, the second drive signal having a second drive frequency; a digital converter circuitry, the digital converter circuitry to receive a first sense signal from the first resonator via the at least one first sense electrode and to convert the first sense signal into first digital temperature data, the first sense signal having a first sense signal frequency and the first digital temperature data to represent a first temperature corresponding to the first sense signal frequency; and the digital converter circuitry to receive a second sense signal from the second resonator via the at least one second sense electrode and to convert the second sense signal into second digital temperature data, the second sense signal having a second sense signal frequency and the second digital temperature data to represent a second temperature corresponding to the second sense signal frequency.

Example 17: The apparatus according to any of Examples 13 to 16, wherein the digital converter circuitry comprises a temperature-to-digital converter (TDC).

Example 18: The apparatus according to any of Examples 13 to 17, comprising: the electronic circuitry comprising: a temperature control circuitry, the temperature control circuitry to control a voltage or current of the one or more heating elements to maintain a temperature of the semiconductor body at a predetermined temperature, and to adjust the voltage or current of the one or more heating elements at least partially based on a ratio of changes in the first temperature represented by the first digital temperature data and the second temperature represented by the second digital temperature data, respectively.

Example 19: The apparatus according to any of Examples 13 to 18, wherein the predetermined temperature comprises a turnover temperature of the first resonator.

Example 20: The apparatus according to any of Examples 13 to 19, wherein: the first resonator having a first temperature coefficient of frequency, and the second resonator having a second temperature coefficient of frequency, the second temperature coefficient of frequency different from the first temperature coefficient of frequency.

Example 21: The apparatus according to any of Examples 13 to 20, wherein: the first resonator comprises a reference resonator; the second resonator comprises a temperature-sensing resonator; and the supporting portion mechanically and thermally couples the first resonator and the second resonator.

Example 22: The apparatus according to any of Examples 13 to 21, the second resonator to resonate at the second resonating frequency that is generally linearly decreasing as temperature increases over the predetermined temperature range.

Example 23: The apparatus according to any of Examples 13 to 22, wherein: the first resonator comprises an outer portion of the semiconductor body, and the second resonator comprises a central portion of the semiconductor body.

Example 24: The apparatus according to any of Examples 13 to 23, wherein: the first resonator comprises a multi-beam resonator, and the second resonator comprises a multi-ring resonator.

Example 25: The apparatus according to any of Examples 13 to 24, wherein the semiconductor body comprises a single crystal silicon.

Example 26: An apparatus comprising: an oven-controlled microelectromechanical system (MEMS) timing device comprising: a microelectromechanical system including a semiconductor body, the semiconductor body comprising: a multi-beam resonator, the multi-beam resonator to resonate at a first resonating frequency that is generally frequency-stable over a predetermined temperature range, the multi-beam resonator comprising an outer portion of the semiconductor body; a multi-ring resonator, the multi-ring resonator to resonate at a second resonating frequency that decreases as temperature increases over the predetermined temperature range, the multi-ring resonator comprising a central portion of the semiconductor body; a supporting portion to support both the multi-beam resonator and the multi-ring resonator; and one or more heating elements of a heater on, or in, the supporting portion.

Example 27: The apparatus according to Example 26, comprising: a thermally-insulating enclosure of an oven, the thermally-insulating enclosure containing the multi-beam resonator, the multi-ring resonator, and the supporting portion including the one or more heating elements of the heater.

Example 28: The apparatus according to Examples 26 and 27, comprising: at least first and second conductive vias coupled to the one or more heating elements of the heater.

What is claimed is:

1. An apparatus comprising:
a microelectromechanical system (MEMS) including a semiconductor body, the semiconductor body comprising:

a first resonator, the first resonator to resonate at a first resonating frequency that is generally frequency-stable over a predetermined temperature range;
a second resonator, the second resonator to resonate at a second resonating frequency that is generally linearly decreasing or increasing as temperature increases over the predetermined temperature range;
a supporting portion, the supporting portion to support both the first resonator and the second resonator, the supporting portion adjacent and interposed between the first resonator and the second resonator; and
one or more heating elements of a heater distributed on, or in, the supporting portion.

2. The apparatus of claim 1, comprising:
a thermally-insulating enclosure of an oven, the thermally-insulating enclosure containing the first resonator, the second resonator, and the supporting portion including the one or more heating elements of the heater.

3. The apparatus of claim 2, wherein the apparatus comprises an oven-controlled MEMS timing device.

4. The apparatus of claim 1, wherein:
the first resonator has a first temperature coefficient of frequency, and
the second resonator has a second temperature coefficient of frequency, the second temperature coefficient of frequency different from the first temperature coefficient of frequency.

5. The apparatus of claim 1, wherein:
the first resonator comprises a reference resonator;
the second resonator comprises a temperature-sensing resonator; and
the supporting portion mechanically and thermally couples the first resonator and the second resonator.

6. The apparatus of claim 1, wherein the second resonator to resonate at a second resonating frequency that is generally linearly decreasing as temperature increases over the predetermined temperature range.

7. The apparatus of claim 1, wherein the semiconductor body comprises:
at least one first drive electrode of the first resonator;
at least one first sense electrode of the first resonator;
at least one second drive electrode of the second resonator; and
at least one second sense electrode of the second resonator.

8. The apparatus of claim 7, comprising:
at least first and second conductive vias coupled to the one or more heating elements.

9. The apparatus of claim 1, wherein:
the first resonator comprises an outer portion of the semiconductor body, and
the second resonator comprises a central portion of the semiconductor body.

10. The apparatus of claim 9, wherein:
the first resonator comprises a multi-beam resonator, and
the second resonator comprises a multi-ring resonator.

11. The apparatus of claim 1, wherein the semiconductor body comprises a single crystal silicon.

12. The apparatus of claim 1, comprising:
a single die comprising the semiconductor body.

13. An apparatus comprising:
an oven-controlled microelectromechanical system (MEMS) timing device comprising:
a microelectromechanical system including a semiconductor body, the semiconductor body comprising:

a first resonator, the first resonator comprising an outer portion of the semiconductor body, the first resonator to resonate at a first resonating frequency that is generally frequency-stable over a predetermined temperature range;

at least one first drive electrode of the first resonator;

at least one first sense electrode of the first resonator;

a second resonator, the second resonator comprising a central portion of the semiconductor body, the second resonator to resonate at a second resonating frequency that is generally linearly decreasing or increasing as temperature increases over the predetermined temperature range;

at least one second drive electrode of the second resonator;

at least one second sense electrode of the second resonator;

a supporting portion to support both the first resonator and the second resonator; and one or more heating elements of a heater on, or in, the supporting portion.

14. The apparatus of claim 13, comprising:

a thermally-insulating enclosure of an oven, the thermally-insulating enclosure containing the first resonator, the second resonator, and the supporting portion including the one or more heating elements of the heater.

15. The apparatus of claim 14, comprising:

at least first and second conductive vias coupled to the one or more heating elements of the heater.

16. The apparatus of claim 15, wherein the microelectromechanical system is on a first die, the apparatus comprising:

the oven-controlled MEMS timing device comprising:

an electronic circuitry, the electronic circuitry on a second die attached to the first die, the electronic circuitry comprising:

a first drive circuitry, the first drive circuitry to generate a first drive signal to drive the first resonator via the at least one first drive electrode, the first drive signal having a first drive frequency;

a second drive circuitry, the second drive circuitry to generate a second drive signal to drive the second resonator via the at least one second drive electrode, the second drive signal having a second drive frequency;

a digital converter circuitry, the digital converter circuitry to receive a first sense signal from the first resonator via the at least one first sense electrode and to convert the first sense signal into first digital temperature data, the first sense signal having a first sense signal frequency and the first digital temperature data to represent a first temperature corresponding to the first sense signal frequency; and the digital converter circuitry to receive a second sense signal from the second resonator via the at least one second sense electrode and to convert the second sense signal into second digital temperature data, the second sense signal having a second sense signal frequency and the second digital temperature data to represent a second temperature corresponding to the second sense signal frequency.

17. The apparatus of claim 13, wherein the supporting portion is adjacent and interposed between the first resonator and the second resonator.

18. The apparatus of claim 16, comprising:

the electronic circuitry comprising:

a temperature control circuitry, the temperature control circuitry to control a voltage or current of the one or more heating elements to maintain a temperature of the semiconductor body at a predetermined temperature, and to adjust the voltage or current of the one or more heating elements at least partially based on a ratio of changes in the first temperature represented by the first digital temperature data and the second temperature represented by the second digital temperature data, respectively.

19. The apparatus of claim 18, wherein the predetermined temperature comprises a turnover temperature of the first resonator.

20. The apparatus of claim 13, wherein:

the first resonator having a first temperature coefficient of frequency, and the second resonator having a second temperature coefficient of frequency, the second temperature coefficient of frequency different from the first temperature coefficient of frequency.

21. The apparatus of claim 13, wherein:

the first resonator comprises a reference resonator;

the second resonator comprises a temperature-sensing resonator; and the supporting portion mechanically and thermally couples the first resonator and the second resonator.

22. The apparatus of claim 13, the second resonator to resonate at the second resonating frequency that is generally linearly decreasing as temperature increases over the predetermined temperature range.

23. The apparatus of claim 13, wherein:

a temperature offset between the first resonator and the second resonator is zero or negligible, and a thermal gradient between the first resonator and the second resonator is zero or negligible.

24. The apparatus of claim 13, wherein:

the first resonator comprises a multi-beam resonator, and the second resonator comprises a multi-ring resonator.

25. The apparatus of claim 16, wherein the semiconductor body comprises a single crystal silicon.

26. An apparatus comprising:

an oven-controlled microelectromechanical system (MEMS) timing device comprising:

a microelectromechanical system including a semiconductor body, the semiconductor body comprising:

a multi-beam resonator, the multi-beam resonator to resonate at a first resonating frequency that is generally frequency-stable over a predetermined temperature range, the multi-beam resonator comprising an outer portion of the semiconductor body;

a multi-ring resonator, the multi-ring resonator to resonate at a second resonating frequency that decreases as temperature increases over the predetermined temperature range, the multi-ring resonator comprising a central portion of the semiconductor body;

a supporting portion to support both the multi-beam resonator and the multi-ring resonator; and one or more heating elements of a heater on, or in, the supporting portion.

27. The apparatus of claim 26, comprising:

a thermally-insulating enclosure of an oven, the thermally-insulating enclosure containing the multi-beam resonator, the multi-ring resonator, and the supporting portion including the one or more heating elements of the heater.

28. The apparatus of claim 27, comprising:

at least first and second conductive vias coupled to the one or more heating elements of the heater.

\* \* \* \* \*